(12) United States Patent
Rangan et al.

(10) Patent No.: US 11,372,548 B2
(45) Date of Patent: Jun. 28, 2022

(54) TECHNIQUES FOR ACCESSING AND UTILIZING COMPRESSED DATA AND ITS STATE INFORMATION

(71) Applicant: NVIDIA Corporation, Santa Clara, CA (US)

(72) Inventors: Ram Rangan, Tamil Nadu (IN); Patrick Richard Brown, Wake Forest, NC (US); Wishwesh Anil Gandhi, Sunnyvale, CA (US); Steven James Heinrich, Madison, AL (US); Mathias Heyer, San Jose, CA (US); Emmett Michael Kilgariff, San Jose, CA (US); Praveen Krishnamurthy, Apex, NC (US); Dong Han Ryu, Los Gatos, CA (US)

(73) Assignee: NVIDIA Corporation, Santa Clara, CA (US)

( * ) Notice: Subject to any disclaimer, the term of this patent is extended or adjusted under 35 U.S.C. 154(b) by 107 days.

(21) Appl. No.: 16/888,116

(22) Filed: May 29, 2020

(65) Prior Publication Data

US 2021/0373774 A1 Dec. 2, 2021

(51) Int. Cl.
*G06F 3/00* (2006.01)
*G06F 3/06* (2006.01)
*H03M 7/30* (2006.01)

(52) U.S. Cl.
CPC ............ *G06F 3/0608* (2013.01); *G06F 3/064* (2013.01); *G06F 3/0673* (2013.01); *H03M 7/30* (2013.01)

(58) Field of Classification Search
CPC ...... G06F 3/0608; G06F 3/064; G06F 3/0673; H03M 7/30
See application file for complete search history.

(56) References Cited

U.S. PATENT DOCUMENTS

| | | | |
|---|---|---|---|
| 9,912,957 B1* | 3/2018 | Surti | H04N 19/85 |
| 2003/0188110 A1* | 10/2003 | Abali | G06F 12/08 |
| | | | 711/154 |
| 2012/0163655 A1* | 6/2012 | Tanaka | H04N 19/467 |
| | | | 382/100 |
| 2013/0238751 A1* | 9/2013 | Raleigh | H04L 67/26 |
| | | | 709/217 |
| 2016/0224241 A1* | 8/2016 | Verrilli | G06F 12/08 |
| 2019/0235793 A1* | 8/2019 | Aikawa | G06F 3/0659 |
| 2020/0249877 A1* | 8/2020 | McIlroy | G06F 3/0661 |

* cited by examiner

*Primary Examiner* — Craig S Goldschmidt
(74) *Attorney, Agent, or Firm* — Leydig, Voit & Mayer, Ltd.

(57) ABSTRACT

Some systems compress data utilized by a user mode software without the user mode software being aware of any compression taking place. To maintain that illusion, such systems prevent user mode software from being aware of and/or accessing the underlying compressed states of the data. While such an approach protects proprietary compression techniques used in such systems from being deciphered, such restrictions limit the ability of user mode software to use the underlying compressed forms of the data in new ways. Disclosed herein are various techniques for allowing user-mode software to access the underlying compressed states of data either directly or indirectly. Such techniques can be used, for example, to allow various user-mode software on a single system or on multiple systems to exchange data in the underlying compression format of the system(s) even when the user mode software is unable to decipher the compression format.

26 Claims, 13 Drawing Sheets

TECHNIQUES FOR ACCESSING AND UTILIZING COMPRESSED DATA AND ITS STATE INFORMATION

TECHNICAL FIELD

The present disclosure relates to compression, and more particularly to accessing and utilizing the compressed data and compression state information.

BACKGROUND

Some systems compress data utilized by a user mode software without the user mode software being aware of any compression taking place. To maintain that illusion, such systems prevent user mode software from being aware of and/or accessing the underlying compressed states of the data. Hence, there currently exists no mechanism for user mode software to directly access the underlying compressed states of data. Specifically, in such systems, the compression status information (compStatus) indicating whether the data in a memory block is being stored in a compressed or uncompressed format is not visible to user mode software and any compressed data stored in the memory block is automatically decompressed when the user mode software attempts to access the data in the memory block. Therefore, it is not possible for the user mode software to read the compressed version of the data being stored in the memory blocks. While such restrictions protect proprietary compression techniques being used in such systems from being deciphered, such restrictions limit the ability of user mode software to use the underlying compressed forms of the data in new ways. There is a need for addressing these and/or other associated issues.

SUMMARY

Techniques are disclosed for accessing and utilizing compressed data and compression state information. In one embodiment, a method for accessing and utilizing compressed data and compression state information may include the steps of receiving an instruction specifying a memory block in memory, reading the compression status and/or compressed data corresponding to the memory block, and returning the compression status and/or compressed data. In an embodiment, the compressed data is data that was compressed by a system capable of executing user mode software and the data was compressed by the system without the intervention or at the direction of any user mode software. In an embodiment, the compressed data is in a format that user mode software is unable to decompress. In an embodiment, a first user mode software on a first system obtains compressed data and its associated compression status from the first system and transmits them to a second user mode software on a second system, such that the second system can decompress the compressed data for use by, for example, the second user mode software.

DETAILED DESCRIPTION

Figure 1A:
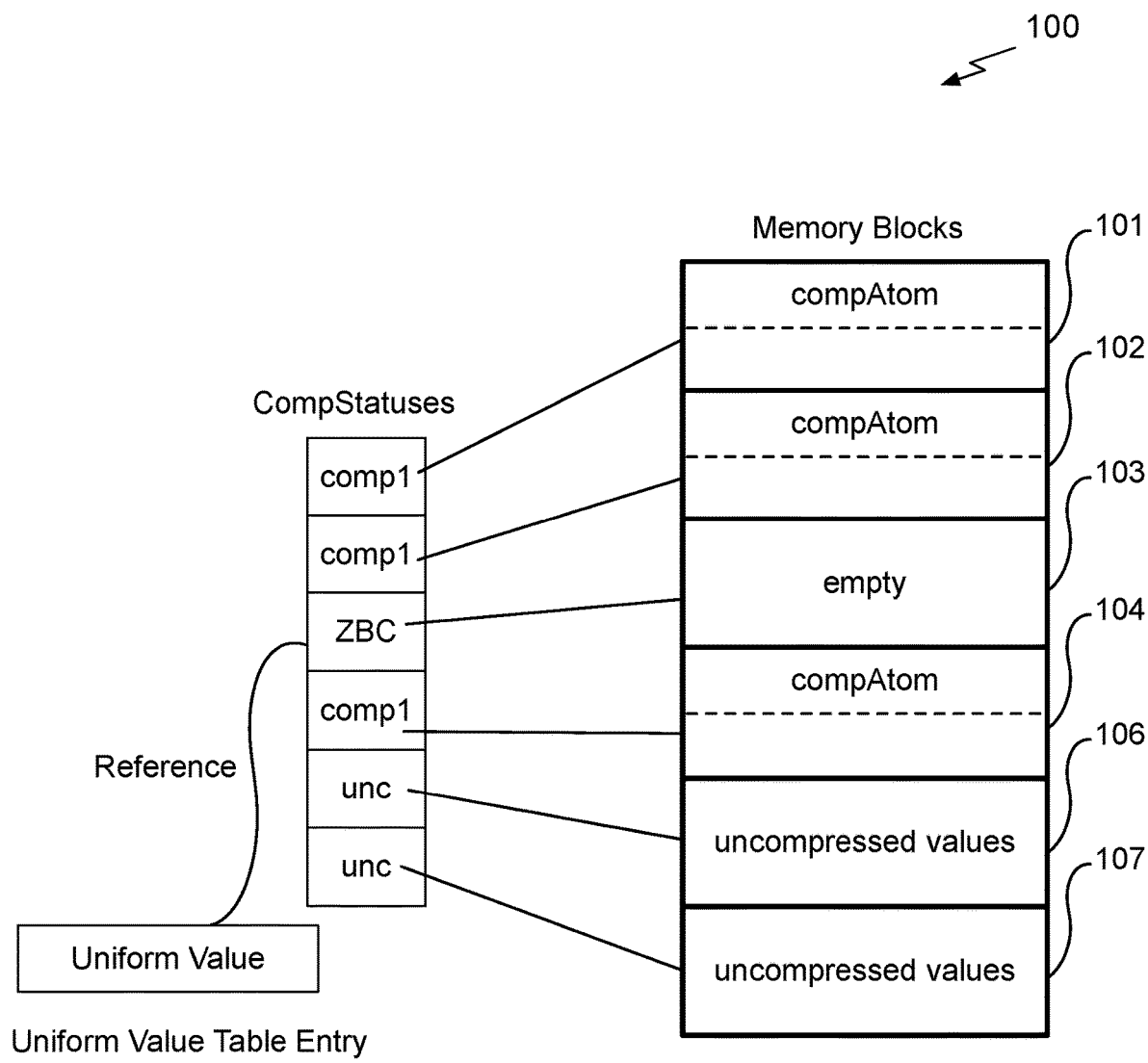
FIG. 1A illustrates an exemplary diagram of compressed and uncompressed memory blocks.

A compression status information (compStatus) corresponding to a memory block indicates at least whether data of the memory block is stored in compressed or uncompressed format. Such data includes one or more values. When the memory block stores data that encodes compressed values, the data is also referred to as a compression atom (compAtom). In an embodiment, a memory block is an amount of memory needed to store the data in an uncompressed format. A memory block may correspond to a contiguous or non-contiguous portion of memory. A compAtom has a size determined by a compression format used to compress the uncompressed data of a memory block. For example, when 2:1 compression is employed, the size of a compAtom is half the size of the memory block. In an embodiment, the compStatus further indicates the compression format of the compAtom stored on a memory block. In such an embodiment, the compStatus is needed to correctly decompress the compAtom.

In an embodiment, a compStatus indicates whether all values associated with a memory block are uniform (the same or near-equal). Values of a memory block are near-equal to each other if the difference between each value in the memory block is within a predefined threshold of an anchor value. The anchor value may, for example, be a value in the memory block, an average of the values of the memory block, or the value occurring most often in the memory block. In an embodiment, when the memory block is uniform, the compStatus corresponding to the memory block stores an index into a table that holds the uniform value, and no values need to be actually stored in the memory block. The values of the memory block can be retrieved by reading an entry in the table using the index in the compStatus. In an embodiment, user mode software is permitted to write directly into a compStatus and the table to quickly set all values associated with a memory block to a uniform value. Thus, when the memory block is part of a frame buffer or a surface, that portion of the frame buffer or surface may be quickly set to a uniform value.

In an embodiment, user mode software can query the compStatuses for memory blocks to identify those that are uniform. When values of a memory block stored on a remote node are needed by a local node, the compStatus for that memory block may be accessed from the remote node. For a uniform memory block, the local node can obtain a single uniform value from the remote node for all of the values in the uniform memory block rather than conventionally causing the remote node to decompress and transfer all of the values of the memory block to the local node. Therefore, the bandwidth needed to transfer uniform memory blocks between the nodes is greatly reduced. In an embodiment, a node is a microprocessor such as a CPU, GPU, or FPGA. In another embodiment, a node is a processing element within a microprocessor such as a core, an ALU, or a fixed function unit. In an embodiment, a node communicates with another node via a transceiver, bus, network, Internet, or shared memory.

Furthermore, when two nodes both understand a particular compStatus and compAtom format, user mode software executing on the two nodes can exchange data in a compressed format even when the user mode software cannot themselves decompress the data. More specifically, the user mode software on a source node can read a compStatus and its corresponding compAtom on the source node and transmit them to a user mode software on the sink node. The user mode software on the sink node can then store the received compStatus and compAtom on the sink node. Because the sink node understands the compStatus and compAtom formats of the source node, the sink node can decompress the compAtom for use by, for example, the user mode software executing on the sink node. Thus, by enabling user mode software to directly access the compStatuses and compAtoms being utilized by the nodes to automatically compress some data being stored on the nodes, user mode software can transmit such data among the nodes with less bandwidth and/or time.

In an embodiment, user mode software is permitted to read and write the compStatuses and the compAtoms stored in a node, thereby bypassing or offloading hardware compression and decompression logic of the node. In an embodiment, a subset of the compStatuses may be reserved for exclusive access by software, having software-defined compression/decompression, while the remaining compStatuses are accessible only by hardware. At least one software-defined compStatus format may be defined and interpreted as needed to perform compression and/or decompression by software.

In an embodiment, different levels of access or permission are defined for software. One or more software programs may be included in a defined group for a particular level of access. The level of access may be used to determine whether the software is permitted to read and write specific compStatuses and compAtoms. For example, a group may be defined for software that can access the reserved subset of compStatuses. The level of access needed to access each compStatus may be stored in the compStatus. Alternatively, the level of access associated with each compStatus and/or group definitions may be stored in a register or with other state information.

FIG. 1A illustrates an exemplary diagram 100 of compressed and uncompressed memory blocks. Each one of six memory blocks 101, 102, 103, 104, 106, and 107 may be uncompressed or compressed using a different compression format, which is identified by the compStatus associated with the memory block. The memory blocks can all be the same size or have different sizes. A memory block can store one or more values. Each value is encoded, for example, in one, two, four, eight, sixteen, or some other number of bytes. A value can represent, for example, a pixel, texel, depth, neural network weight, neural network activation, or any other type of value. Each memory block is associated with a set of memory locations for storing either the compressed or uncompressed values. In an embodiment, the memory locations are in off-chip memory. The compStatus associated with a particular memory block is also associated with the compAtom (e.g., the compressed values) stored in the memory block. In an embodiment, the compStatus is metadata for a memory block. In an embodiment, the compStatus is also stored in the memory block. In another embodiment, the compStatus is stored separately from the memory block. In an embodiment, the compStatuses are stored in off-chip memory and are cached on-chip.

As shown in FIG. 1A, the compStatuses associated with the memory blocks 106 and 107 are uncompressed (unc). The values stored in the memory blocks 106 and 107 are in uncompressed format. The compStatuses associated with three of the memory blocks 101, 102, and 104 are "comp1" indicating that the values associated with those memory blocks are compressed into compAtoms, which are stored in the memory blocks in place of the uncompressed values. A compStatus of "comp1" further indicates that the compAtom stored in the corresponding memory block is compressed using a compression format identified as "comp1." For example, "comp1" may refer to run length encoding compression format, VDC (variable differential compression), or any other compression format. A compAtom of VDC compressed values requires half the storage as when the values are not compressed (e.g., a 256B memory block can be compressed to 128B). Therefore, the compAtom consumes half of the total memory block capacity.

The remaining memory block 103 is associated with compStatus ZBC, indicating the values associated with the memory block are zero bandwidth clear (ZBC) compressed. When all of the values associated with a memory block are uniform, the entire memory block may be encoded using ZBC compression. The compStatus for a ZBC compressed memory block includes a reference (e.g., index) to an entry in a uniform value table, where each entry in the table may store a value. When a memory block is ZBC compressed, all of the values associated with the memory block are considered to have the same value as the value stored in the uniform value table entry referenced by the memory block's compStatus. The uniform value table may be stored on-chip rather than being stored in off-chip memory. Additional memory blocks (not shown) may also be ZBC compressed. In an embodiment, additional values are stored in different entries of the uniform value table and each entry may be referenced by one or more compStatuses for their corresponding memory blocks. In an embodiment, the compStatus may contain information indicating whether or not the values associated with a memory block are compressed, the compression format used to encode the values, and/or an index corresponding to an entry in the uniform value table.

Figure 1B:
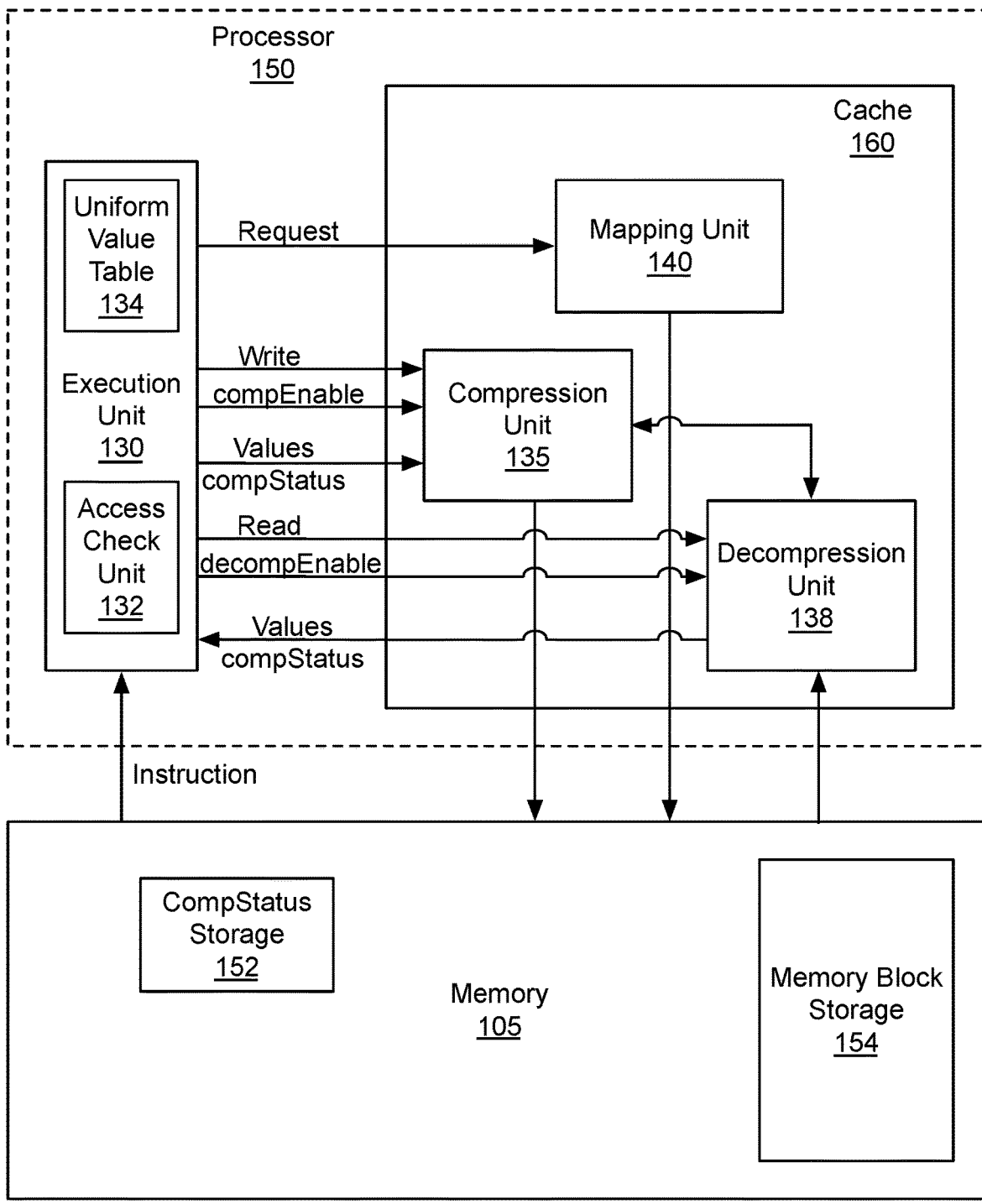
FIG. 1B illustrates an exemplary system for accessing compressed values and compression status including a processor and memory.

FIG. 1B illustrates an exemplary system including a processor 150 and memory 105 for accessing compressed values and compression status information. Processor 150 may be a GPU (graphics processing unit), CPU (central processing unit), FPGA (field programmable gate array), or any other type of processor. In an embodiment, processor 150 is the parallel processing unit 300 shown in FIG. 3.

Processor 150 includes an execution unit 130 and cache 160. Processor 150 is coupled to a dedicated local memory 105. Processor 150 receives and executes instructions, including instructions to query, read, and/or write compStatus storage 152 and/or memory block storage 154. The instructions include one or more operands. In an embodiment, one of the operands is an identifier for a compStatus, compAtom, and/or memory block. An example of such an identifier is a virtual or physical memory address associated with a memory block. Execution unit 130 generates requests to the cache 160 as needed to execute the instructions. At least a portion of the memory block storage 154 and/or compStatus storage 152 may be loaded into the cache 160.

A mapping unit 140 receives a request including an address for a memory block from the execution unit 130 and where necessary translates the address to a corresponding physical address that is output to the memory 105. In an embodiment, the mapping is not exposed and is securely handled exclusively in the processor 150. The request may specify a read or write to either the compStatus storage 152 or the memory block storage 154. For some instructions, the compStatus for the memory block is read first and, based on the compStatus, execution unit 130 determines if at least a portion of the memory block (e.g., compAtom) should be read. For example, when an instruction to access a value in a memory block is executed and the corresponding compStatus indicates that the memory block is ZBC compressed, the memory block is not read. Instead, execution unit 130 reads an entry of a uniform value table 134 using an index included in the compStatus to obtain the value rather than read the value from memory 105. In an embodiment, the uniform value table 134 is stored in the cache 160.

In an embodiment, an access check unit 132 is configured to restrict access to the compStatus storage 152 and/or the memory block storage 154 to certain types of software. For example, certain types of user mode software may be permitted to access some or all of the compStatus Storage 152. As described further herein, a request to read compStatus may result in the actual bits of the compStatus or information about the compStatus being made available to the requesting software. A request to write compStatus may be allowed or restricted to a set of certain comp Statuses that include certain predefined bit patterns. A request to read a memory block may return the values in compressed or uncompressed form, as controlled by the execution unit 130. Execution unit 130 provides values, read, write, compression enable (compEnable), and decompression enable (decompEnable) signals to the cache 160 and the cache 160 provides compressed or uncompressed values and one or more compStatuses.

Cache 160 includes compression unit 135 and decompression unit 138. For write requests, compression unit 135 may compress values obtained from the execution unit 130 together with potentially other values obtained from memory 105 via the decompression unit 138 and transmit compressed or uncompressed values to the memory 105. The compEnable signal enables/disables compression of the values stored to the memory block storage 154. Similarly, decompression unit 138 obtains compressed or uncompressed values from memory 105 and may decompress the values before providing some or all of the decompressed values to the execution unit 130. The decompEnable signal enables/disables decompression of the values read from the memory block storage 154. In an embodiment, the compression unit 135 and decompression unit 138 simply pass values read from or written to the compStatus storage 152 without any processing.

Generally, software (e.g., instructions, program, driver, code, application, and the like) executing in kernel mode (e.g., kernel mode driver) is allowed access to any resource (e.g., memory, cache, registers, and the like) on the system it is executing within, and software executing in user mode (e.g., user mode driver or application) is allowed limited access to such resources for security reasons. For example, in a conventional system, user mode software cannot directly read or write either the compStatus storage 152 or the memory block storage 154. In an embodiment, values written to and read from the memory block storage 154 are automatically compressed and decompressed, respectively. The compression and decompression are automatic in the sense that they are performed without the software requesting the read or write operation requesting or specifying that such compression and/or decompression be performed. In such an embodiment, the compression format used to store data in a memory block is may be opaque (unknown) to user mode software, ensuring that the compression algorithm and/or format used by the underlying system is not revealed. In an embodiment, kernel mode software allocates locations in the memory 105 to store compStatuses for all compressible data created by the user mode software. However, for security reasons, the kernel mode software may not provide the user mode software with direct access to the compStatuses. Specifically, in such systems, compStatus can be accessed using conventional instructions (e.g., read, write, load, and store) by software executing in kernel mode and cannot be accessed using the conventional instructions by software executing in user mode, making the compStatuses and compAtoms secure against user mode software. To overcome these limitations, instructions (referred to as access instructions) may be provided that allow user mode software to access compStatuses and/or compAtoms.

In an embodiment, different categories of new access instructions are provided for user mode software to access compStatus storage 152 and memory block storage 154. In an embodiment, raw, limited, and abstract categories of access instructions are made available to user mode software.

Raw category of access instructions allow user mode software to read and/or write compStatuses, compAtoms, and memory blocks directly. In particular, the memory blocks may be read (bypassing the automatic decompression circuitry) and written (bypassing automatic compression circuitry) using the raw instructions.

Limited category of access instructions allow user mode software to read and/or write a limited set of compStatuses, compAtoms, and/or corresponding memory blocks. In an embodiment, user mode software may use the limited instructions to access only software-defined compStatuses, compAtoms, and/or corresponding memory blocks. In an embodiment, user mode software may use the limited instructions to access only a subset of compStatuses, compAtoms, and/or corresponding memory blocks that are used in a system, regardless of whether they are defined by software (kernel mode or user mode) or by the hardware.

Abstract category of instructions allow user mode software to obtain information about compStatuses, compAtoms, and/or corresponding memory blocks without the user mode software directly accessing the bits of the compStatus, compAtoms, and/or corresponding memory blocks. For example, an abstract instruction can be used by a user mode software to determine whether a memory block is entirely uniform and to obtain the uniform value. Abstract querying capability also enables algorithms using the results of those queries to be used without modification across multiple system architectures with substantial differences in their underlying compression algorithms. Such a restricted, abstract querying capability can be employed in user mode software for various optimizations without exposing any direct information about the compression algorithm or architecture that the system is using to generate and store compStatuses and compAtoms. For example, after a frame buffer is cleared to a uniform value and an image has been rendered into the frame buffer, a user mode software can use the abstract instructions to quickly identify the portions of the frame buffer that include a rendered image and the portions that remain empty (e.g., still have only uniform values originally used to clear the frame buffer).

Figure 1C:
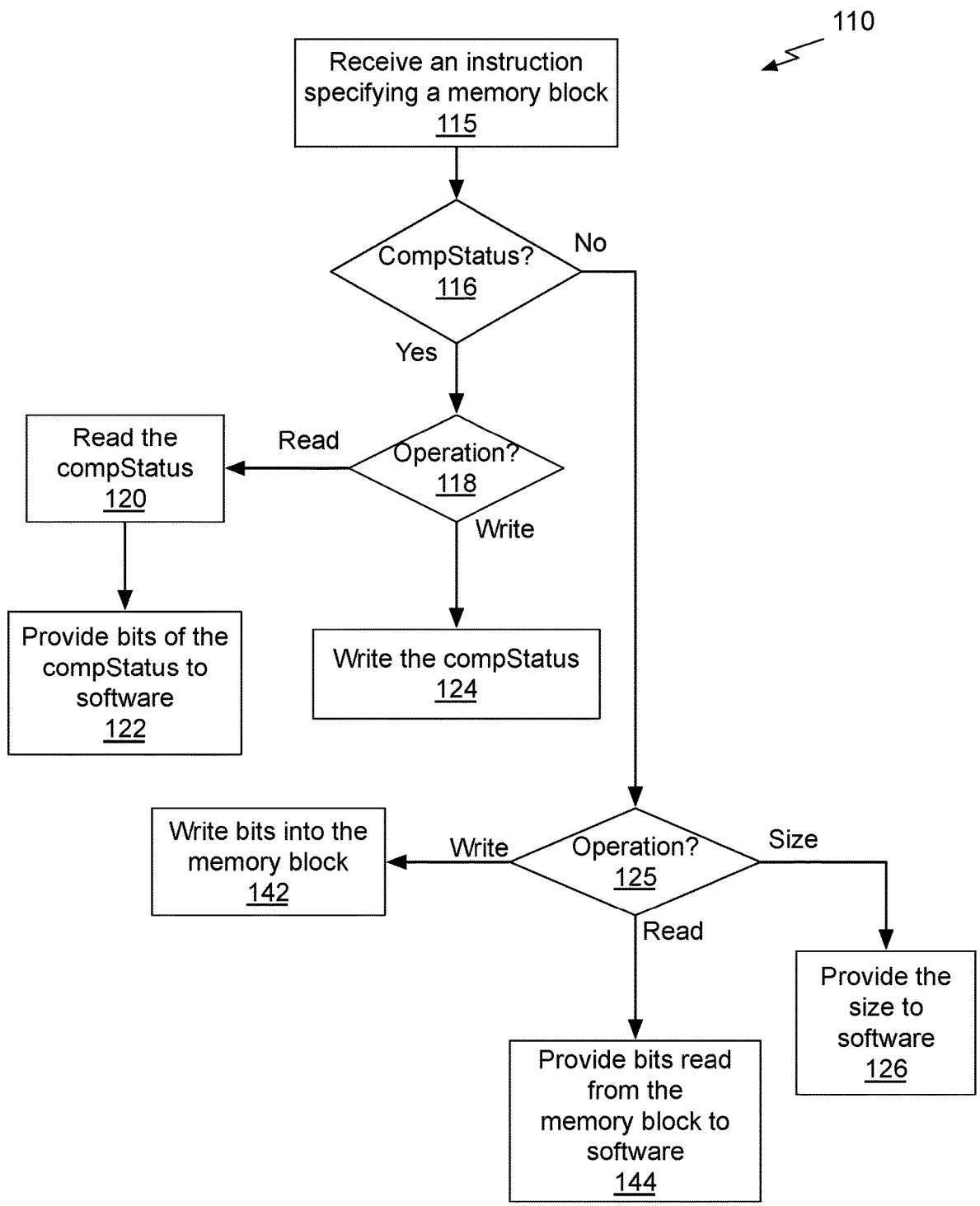
FIG. 1C illustrates an exemplary flowchart of a method for accessing compressed values and compression status of a memory block.

FIG. 1C illustrates an exemplary flowchart of a method 110 for accessing compressed values and compression status of a memory block. At step 115, an access instruction specifying a memory block is received by a processor, such as processor 150. In an embodiment, an identifier associated with the memory block is provided as an instruction operand. In an embodiment, the access instruction is included in the raw instruction category. The access instruction may be used to read or write the compStatus for the memory block or to read or write the compAtom stored in the memory block without decompressing or compressing the values. In an embodiment, the access instruction is used to obtain a size of the compAtom.

At step 116, if the instruction is for accessing the compStatus of the memory block, the method 110 moves to step 118. At step 118, if the instruction is for a read operation, the method 110 moves to step 120 and if the instruction is for a write operation, the method 110 moves to step 124. Returning to step 116, if the instruction is for accessing the values of the memory block, the method 110 moves to step 125. At step 125, the method 110 moves to step 144 if the instruction is for a read operation, the method 110 moves to step 142 if the instruction is for a write operation, and the method 110 moves to step 126 if the instruction is for a size operation. Steps 116, 118, and 125 are performed by processor 150 (or execution unit 130) by inspecting, for example, the opcode of the instruction. In an embodiment, some or all three steps 116, 118, and 125 can be performed in a single step. In an embodiment, some or all of steps 116, 118, and 125 can be performed in a single step along with speculative read operations for steps 120, 126, and 144 and speculative write operations for steps 124 and 142.

At step 120, processor 150 (or execution unit 130) accesses the compStatus for the memory block via the cache 160, which accesses compStatus storage 152 as needed if the compStatus is not already cached in cache 160. At step 122, execution of the instruction is completed by making the bits of the compStatus accessible to the software which caused the instruction to be executed. For example, all or portions of the actual compStatus bits are copied into a register and/or memory location accessible to the software. In an embodiment, actual bits of the compStatus is accessible to user mode software only by using an access instruction and compStatus cannot be accessed by user mode software using conventional instructions.

At step 124, processor 150 (or execution unit 130) writes or modifies the bits of the compStatus for the memory block based on an operand provided or included with the instruction. The compStatus is written to memory 105 via the cache 160, which access compStatus storage 152 as needed. For example, to set all of the values of a memory block with a single uniform value, the bits of compStatus for the memory block can be modified to indicate that the memory block is ZBC compressed and to indicate that the uniform value for the memory block can be located at a particular uniform value table entry.

At step 126, processor 150 (or execution unit 130) determines whether the memory block stores a compAtom by inspecting the compStatus associated with the memory block. If the memory block stores a compAtom, the processor 150 (or execution unit 130) completes execution of the instruction by making the size of the compAtom accessible to the software which caused the instruction to be executed. If the memory block stores uncompressed or ZBC compressed values, the processor 150 (or execution unit 130) completes execution of the instruction by making the size of the uncompressed values of the memory block accessible to the software which caused the instruction to be executed. For example, bits representing the size is copied into a register and/or memory location accessible to the software. In an embodiment, the size represents the number of units (e.g., beats) that are used to encode a compAtom. The number of units needed to encode a compAtom depends on the compression format used to encode the memory block. For example, if each unit is 4 bytes and a 4:1 reduction compression of 128 bytes results in a compAtom of size 32 bytes and the compAtom is encoded in 32/4=8 units. Similarly, a 2:1 compression of 128 bytes will be encoded in 16 units.

At step 144, processor 150 (or execution unit 130) determines whether the memory block stores a compAtom by inspecting the compStatus associated with the memory block. If the memory block stores a compAtom, the processor 150 (or execution unit 130) completes execution of the instruction by making the compressed values (compAtom) of the memory block accessible to the software which caused the instruction to be executed without decompressing the values. In other words, at step 144, the processor 150 (or execution unit 130) does not enable the decompression unit 138 to decompress the compAtom when reading from the memory block storage 154. Instead the compAtom is read from block storage 154 and all or portions of the compAtom is made accessible to the software that caused the instruction to be executed. For example, all or portions of the actual compAtom bits are copied into one or more registers and/or memory locations accessible to the software. In an embodiment, an index is provided as an operand for the instruction. The index specifies an offset from the start of the memory block and the instruction may specify that all or portions of the bits starting from the index be read (without decompression) and made accessible to the software that caused the instruction to be executed.

At step 142, processor 150 (or execution unit 130) completes execution of the instruction by writing one or more bits into the memory block based on a data operand referenced or included with the instruction. In an embodiment, when writing the bits to the memory block will cause the memory block to store uniform values, the processor 150 (or execution unit 130) completes execution of the instruction by ZBC compressing the memory block. In another embodiment, the bits are written into the memory block without compression unit 135 compressing the bits prior to writing the bits to the memory block storage 154. The bits, however, may represent compressed values, where the values were previously compressed prior to the instruction being executed. In an embodiment, an index that specifies an offset within the memory block is provided as another operand with the instruction, and the instruction may specify that all or some portions of the bits specified by the data operand is written to the memory block starting at a location specified by the index operand. In an embodiment, all or portions of the bits specified by the data operand are merged with existing bits previously written to the memory block, thereby overwriting a portion of the existing bits in the memory block.

Figure 1D:
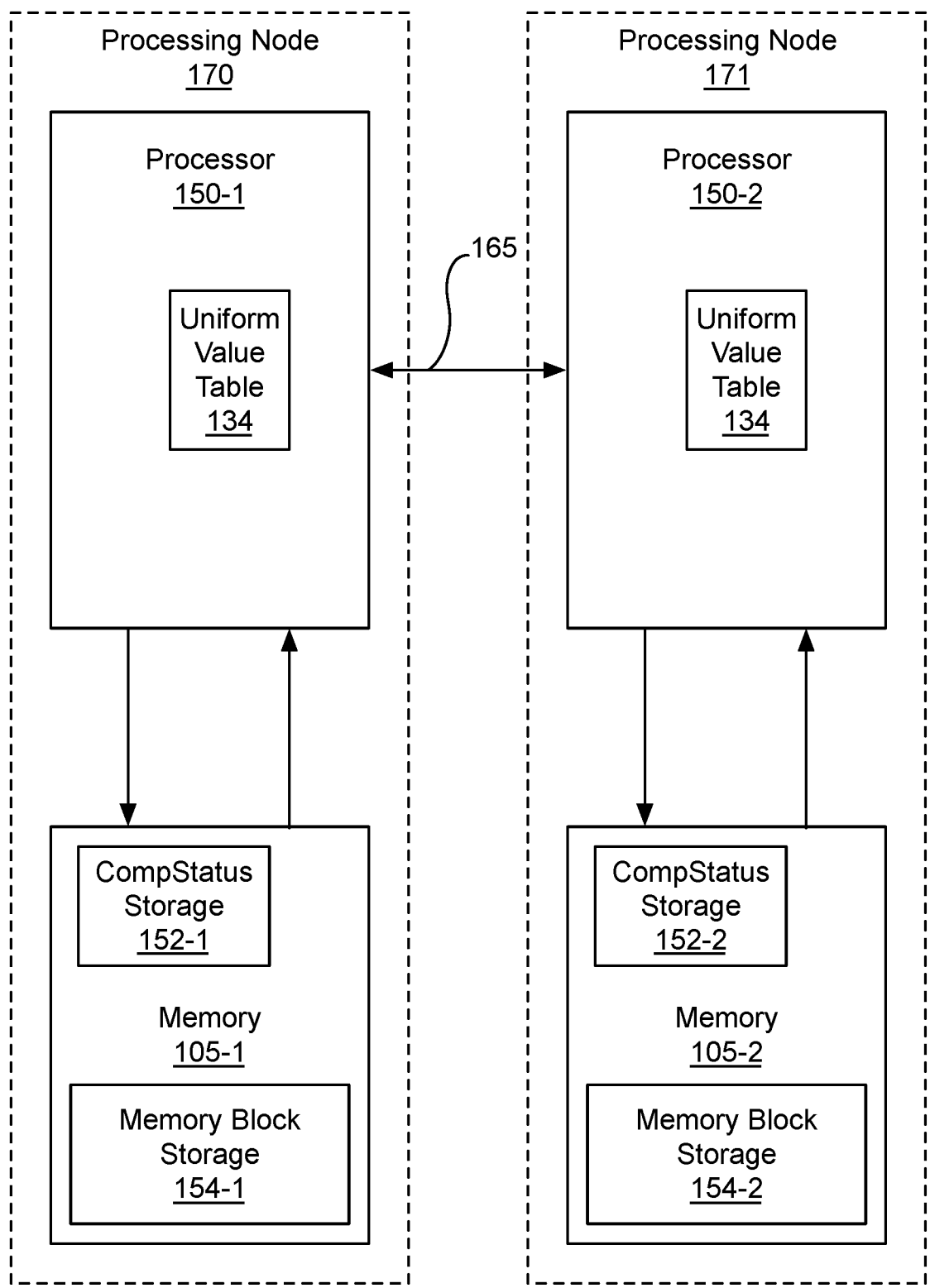
FIG. 1D illustrates an exemplary system in which multiple processors can access and/or transfer compressed values and compression status information among them.

FIG. 1D illustrates an exemplary system in which multiple processors 150 can access and/or transfer compressed values and compression status information among them. As shown in FIG. 1D, processor 150-1 and memory 105-1 represent a first processing node 170, and processor 150-2 and memory 105-2 represent a second processing node 171. In an embodiment, each of the nodes 170 and 171 is a parallel processing unit (PPU) in system 500 and/or 525 shown in FIGS. 5B and 5C, respectively. Raw, limited, and/or abstract category of access instructions may be used to reduce the amount of data that needs to be transmitted between processing nodes when one processing node needs values from another processing node.

For example, in a scanline interleaved (SLI) configuration, rendering of a single image may be distributed among multiple processing nodes such that each processing node renders only a portion of the entire image. Conventionally, accessing a portion of the image generated by remote processing node 171 by local processing node 170 may be performed by transferring uncompressed values of the image from remote memory 105-2 to local processor 150-1 or local memory 105-1 through an interface 165. Instead of transferring uncompressed values from memory block storage 154-2, the compStatuses in compStatus storage 152-2 may be accessed by the local processing node 170 via an access instruction executing on processing node 171. Using the compStatus information for processing node 171, processing node 170 only needs to obtain the single uniform value for a ZBC compressed memory block on processing node 171 in order to access all the values of the ZBC compressed memory block on processing node 171. Accordingly, a compStatus read access instruction may be used to reduce the amount of data that needs to be transmitted between two nodes when ZBC compression is used on the nodes. In another embodiment, using the compStatus information for processing node 171, processing node 170 may request a compAtom (which stores compressed values) of a memory block be retrieved on processing node 171 and that the compAtom be transmitted to processing node 170 via the interface 165. So long as processing node 170 understands how to decompress the compAtom obtained from processing node 171 based on a corresponding compStatus also obtained from processing node 171, processing node 170 is able to decompress the compAtom to access the decompressed values of the compAtom. By transferring compAtoms instead of uncompressed values of a memory block between processing nodes, less data needs to be transferred between the processing nodes. Software executing on processing nodes 170 and 171 may effectuate the transmission of compStatuses and compAtoms between the nodes. Software on nodes 170 and 171 can communicate with each other. Software on each node can use access instructions to obtain compStatuses, compAtoms, and uniform values for ZBC compressed memory blocks on its own node. Once obtained, the software on a node can transmit one or more compStatus, compAtom, or uniform value from its node to software on another node. At the other node, software executing on the other node can receive the compStatus, compAtom, or uniform value and write such information to its node using one or more of the access instructions. As long as some portion of the node (such as decompression unit 138) understands how to decompress a compAtom, the software causing a compAtom to be transmitted between the two nodes does not itself need to be able to understand the compression format of the compAtom.

As previously described, the limited category of access instructions allows user mode software access to the actual bits of the compStatuses and compAtoms for certain types of compStatuses and/or compAtoms. The particular compStatuses and compAtoms that can be accessed by the user mode software may be controlled. For example, one or more fields of a compStatus may indicate the type of compression being used in a corresponding memory block, an identification of a user-mode software corresponding to the memory block, or some other identifier indicating an access restriction for the memory block. Such fields may be checked to determine if a particular user mode software may access the compStatus and/or corresponding memory block. If access is permitted, the actual bits of such compStatuses and/or corresponding compAtoms may be accessed by the user mode software. When the bits of a compAtom are directly accessed using the limited access instructions, the bits are returned directly, bypassing the automatic compression/decompression circuitry. In other words, for limited access instructions, execution unit 130 does not enable the compression unit 135 and a decompression unit 138 for compression and decompression, respectively. Access check unit 132 determines whether execution of a limited access instruction is permitted for a particular user mode software and/or memory block. In an embodiment, a limited access instruction that reads or writes a compAtom is allowed to execute only when the compStatus for the compAtom indicates the user mode software causing the instruction to be executed is permitted to do so.

A limited access instruction that writes a compAtom associated with a software-defined compStatus includes values encoded in the software-defined compressed format. Therefore, the values should not be compressed by the compression unit 135. Similarly, when compAtoms are read from memory block storage 154 using a limited access instruction, the values are made accessible to the software without being decompressed by the decompression unit 138. Software-defined compression enables memory blocks to be stored in a software-defined compressed format, offloading compression and/or decompression workloads from processor 150.

Figure 2A:
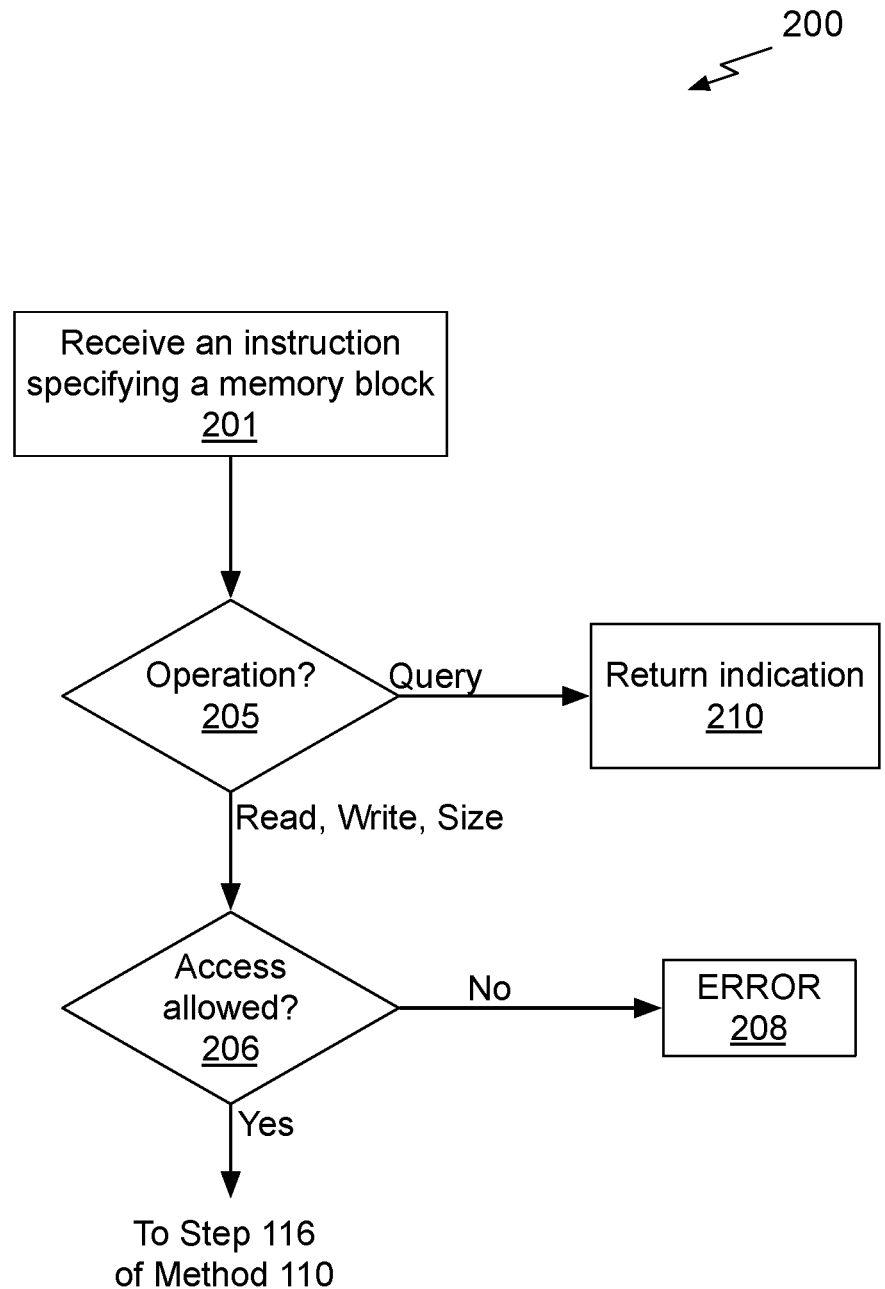
FIG. 2A illustrates an exemplary flowchart of a method for accessing compressed values and compression status of a memory block.

FIG. 2A illustrates an exemplary flowchart of a method 200 for accessing compressed values and compression status of a memory block. At step 201, an access instruction specifying a memory block is received by a processor. In an embodiment, an identifier associated with the memory block is provided as an instruction operand. In an embodiment, the instruction is a limited access instruction. Execution of the instruction causes a check to be performed to determine whether the compStatus and/or compAtom is accessible to the software causing the instruction to be executed. For example, the check may determine whether the software is included in a group that has permission to access the compStatus and/or compAtom of the memory block. In another example, the check may determine whether the compStatus and/or compAtom of the memory block is compressed in a particular type of compression format that is permitted to be accessed by any software. In yet another example, the check may compare all or some of the bits of compStatus of the memory block with a software-defined bit pattern provided as an operand to the instruction to determine whether the software is permitted to access the compStatus and/or compAtom of the memory block.

At step 205, if the instruction is for querying whether the software is permitted to access the compStatus and/or compAtom of the memory block, method 200 moves to step 210. Otherwise, the method 200 moves to step 206.

At step 210, a check, as descried above, is performed to determine whether the software has access to the compStatus and/or compAtom of the memory block. Execution of the instruction is completed by providing an indication of that check to the software causing the instruction to be executed. For example, the indication may be one or more Boolean (e.g., true/false) values indicating whether the software has access to the compStatus, compAtom, both, or neither.

At step 206, if the instruction is for accessing the compStatus and/or compAtom of the memory block, a check as described above is performed to determine whether the software has access to the compStatus and/or compAtom of the memory block. If the software does not have access, method 200 completes execution of the instruction by signaling an error in step 208 to the software that caused the instruction to be executed and/or by signaling the system (such as kernel-mode software) of the error. If the software does have access, method 200 continues to step 116 of the method 110 shown in FIG. 1C.

Steps 205 and 206 are performed by processor 150 (or execution unit 130) by inspecting, for example, the opcode of the instruction. In an embodiment, some or all steps 205, 206, 116, 118, and 125 can be performed in a single step.

In addition to the raw and limited categories of access instructions, an abstract category of access instructions is provided to allow software to obtain information about the compStatus and/or compAtom of a memory block without providing the software with the actual bits of the compStatus and/or compAtom. For example, an abstract access instruction may indicate to the software whether a memory block is entirely uniform without providing the actual bits of the compStatus to the software. Another abstract access instruction, for example, may provide the software with a single uniform value for the memory block or an indication that the memory is not uniform without providing the software with access to the actual bits of the compStatus, compAtom, and/or uniform value table. Such a restricted, abstract querying capability can be employed by user mode software to effectuate various optimizations such as those described with reference to FIG. 1D without exposing any direct information about the processes and data structures the system is using to generate and store compStatuses and compAtoms.

Figure 2B:
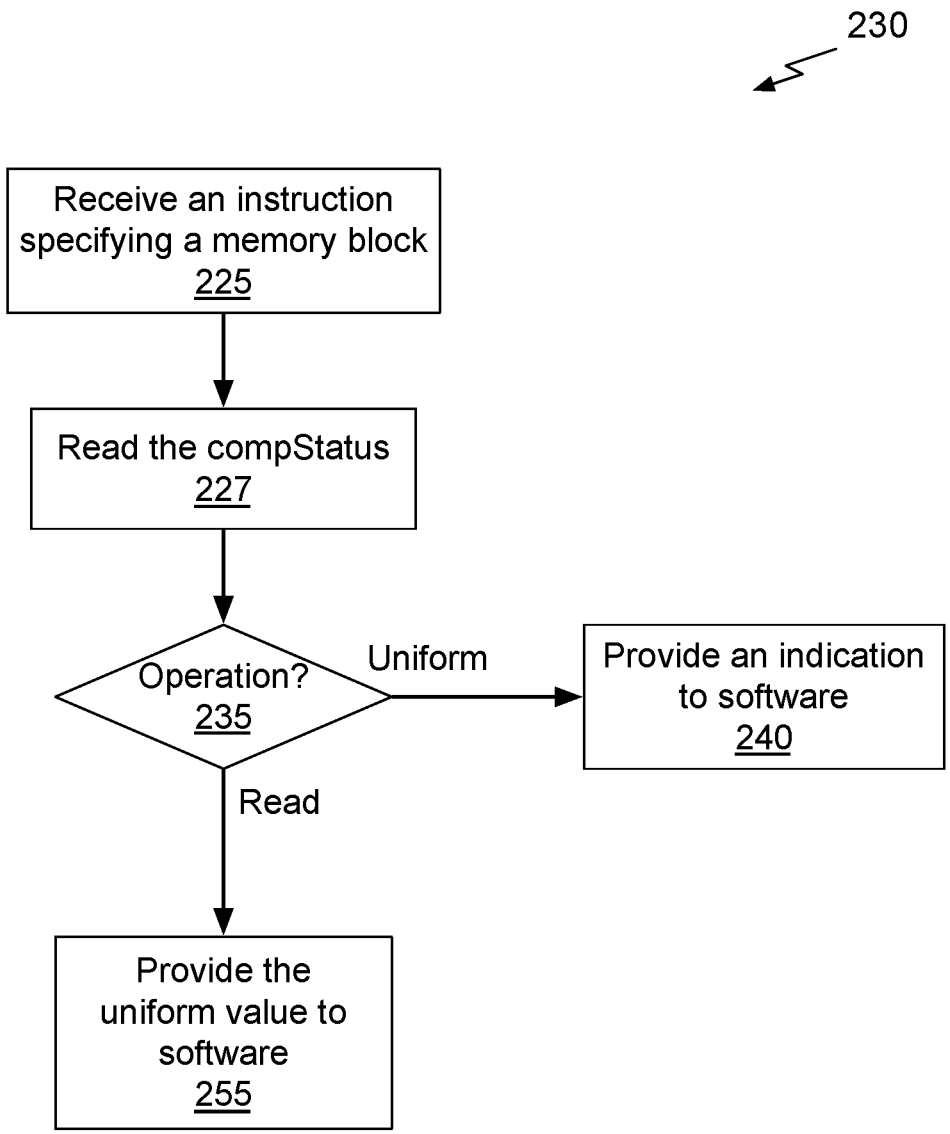
FIG. 2B illustrates an exemplary flowchart of a method for accessing compressed values and compression status of a memory block.

FIG. 2B illustrates an exemplary flowchart of an exemplary method 230 for accessing compressed values and compression status of a memory block. At step 225, an access instruction specifying a memory block is received by a processor. In an embodiment, an identifier associated with the memory block is provided as an instruction operand. In an embodiment, the access instruction is an abstract instruction that is used to provide indirect information about the compStatus of the memory block to the software causing the instruction to be executed. For example, the access instruction may be used to check if the compStatus indicates that the memory block is uniform or is ZBC compressed (e.g., cleared). Alternatively, the access instruction may be used to obtain the uniform value for a memory block that is uniform or ZBC compressed.

At step 227, processor 150 (or execution unit 130) accesses the compStatus for the memory block via the cache 160, which accesses compStatus storage 152 as needed if the compStatus is not already cached in cache 160.

At step 235, if the operation is a check instruction to determine if the memory block is uniform, method 230 moves to step 240. At step 240, processor 150 (or execution unit 130) examines the compStatus of the memory block to determine whether the values of the memory block are uniform. Execution of the instruction is completed by providing an indication of whether the values are uniform to the software which caused the instruction to be executed. In an embodiment, the indication comprises a Boolean, where True indicates the values are uniform and False indicates the values are not uniform.

Returning to step 235, if the operation is a read instruction to obtain a uniform value of the memory block, method 230 moves to step 255. At step 255, processor 150 (or execution unit 130) completes execution of the instruction by providing the uniform value of the memory block to the software which caused the instruction to be executed or an error indication if the values of the memory block are not uniform. The uniform value may be read from the uniform value table 134 using the index encoded in the compStatus of the memory block. Alternatively, the uniform value may be obtained from the compAtom associated with the memory block. Importantly, the bits of compStatus for the memory block are not exposed when an abstract category instruction is executed.

In other embodiments, the abstract category of access instructions may be used to write the compStatus and/or compAtom for a memory block. For example, software may write the compStatus to indicate that the memory block is uniform and provide the uniform value.

In sum, the abstract category of access instructions may be used to obtain indirect information about what the compStatuses and compAtoms specify, rather than for accessing the actual bits of the compStatuses or compAtoms. In contrast, the limited and raw categories of instructions provide direct access for some or all compStatuses and/or compAtoms. In an embodiment, the raw category of access instructions is intended for use by user-mode software that is provided by the processor manufacturer/supplier (e.g., proprietary driver software of the processor manufacturer/supplier).

Providing the abstract, limited, and raw categories of access instructions enables user mode code to read and write compStatus and compAtoms for optimizations (such as those described above with reference to FIG. 1D) while ensuring security of the hardware-defined compression algorithms. When the bits of the compStatus and/or compAtoms are written directly by software using raw or limited access instructions, such writes should be performed in a manner that is compatible or does not disturb existing hardware compression schemes. Each of the abstract, limited, and raw category access instructions may be used to reduce the amount of data that needs to be transmitted between nodes in a multi-node system.

Parallel Processing Architecture

Figure 3:
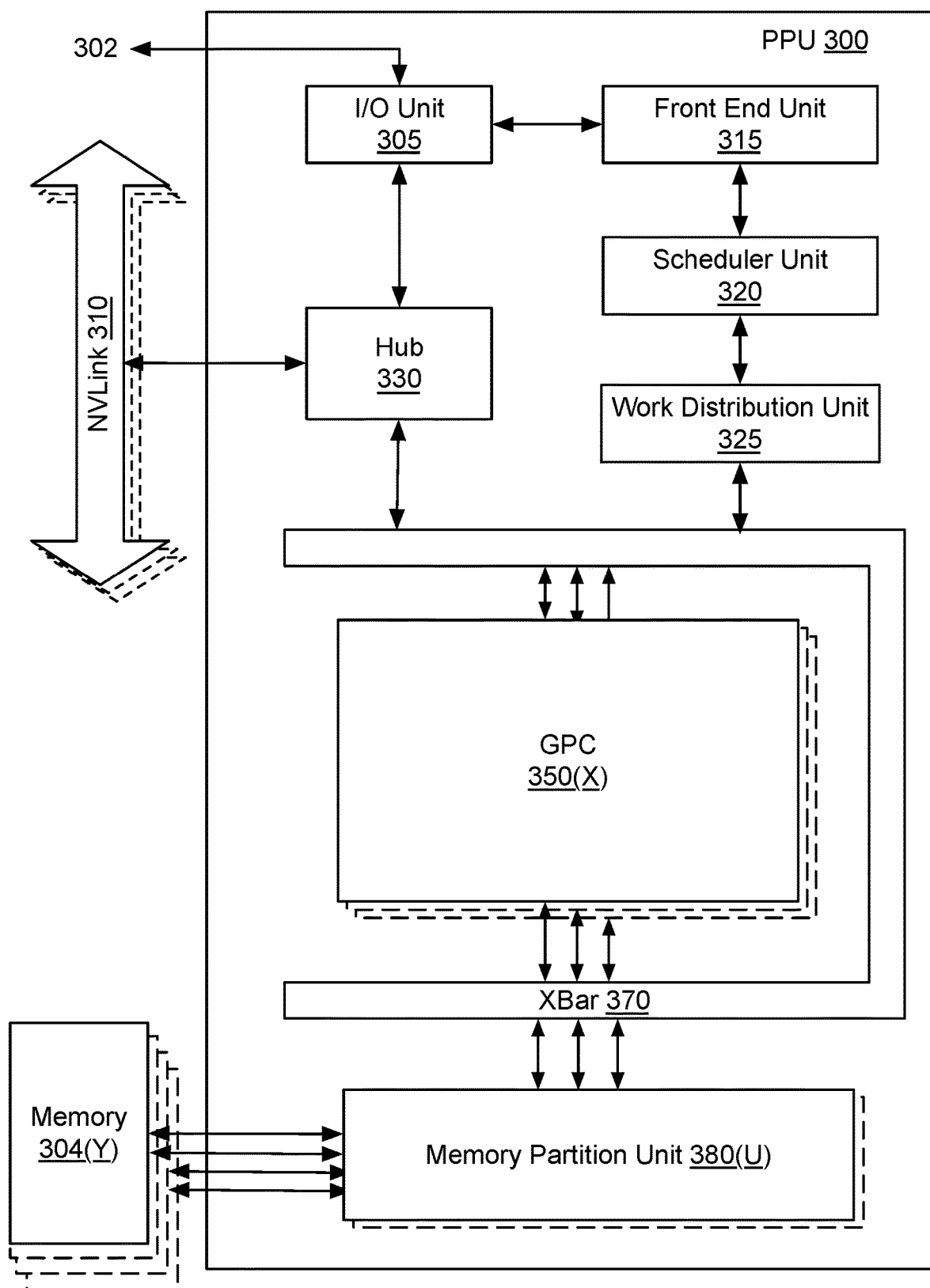
FIG. 3 illustrates an exemplary parallel processing unit.

FIG. 3 illustrates a parallel processing unit (PPU) 300, in accordance with an embodiment. In an embodiment, the PPU 300 is a multi-threaded processor that is implemented on one or more integrated circuit devices. The PPU 300 is a latency hiding architecture designed to process many threads in parallel. A thread (e.g., a thread of execution) is an instantiation of a set of instructions configured to be executed by the PPU 300. In an embodiment, the PPU 300 is a graphics processing unit (GPU) configured to implement a graphics rendering pipeline for processing three-dimensional (3D) graphics data in order to generate two-dimensional (2D) image data for display on a display device such as a liquid crystal display (LCD) device. In other embodiments, the PPU 300 may be utilized for performing general-purpose computations. While one exemplary parallel processor is provided herein for illustrative purposes, it should be strongly noted that such processor is set forth for illustrative purposes only, and that any processor may be employed to supplement and/or substitute for the same.

One or more PPUs 300 may be configured to accelerate thousands of High Performance Computing (HPC), data center, and machine learning applications. The PPU 300 may be configured to accelerate numerous deep learning systems and applications including autonomous vehicle platforms, deep learning, high-accuracy speech, image, and text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and the like.

As shown in FIG. 3, the PPU 300 includes an Input/Output (I/O) unit 305, a front end unit 315, a scheduler unit 320, a work distribution unit 325, a hub 330, a crossbar (Xbar) 370, one or more general processing clusters (GPCs) 350, and one or more memory partition units 380. The PPU 300 may be connected to a host processor or other PPUs 300 via one or more high-speed NVLink 310 interconnect. The PPU 300 may be connected to a host processor or other peripheral devices via an interconnect 302. The PPU 300 may also be connected to a local memory 304 comprising a number of memory devices. In an embodiment, the local memory may comprise a number of dynamic random access memory (DRAM) devices. The DRAM devices may be configured as a high-bandwidth memory (HBM) subsystem, with multiple DRAM dies stacked within each device.

The NVLink 310 interconnect enables systems to scale and include one or more PPUs 300 combined with one or more CPUs, supports cache coherence between the PPUs 300 and CPUs, and CPU mastering. Data and/or commands may be transmitted by the NVLink 310 through the hub 330 to/from other units of the PPU 300 such as one or more copy engines, a video encoder, a video decoder, a power management unit, etc. (not explicitly shown). The NVLink 310 is described in more detail in conjunction with FIG. 5B.

The I/O unit 305 is configured to transmit and receive communications (e.g., commands, data, etc.) from a host processor (not shown) over the interconnect 302. The I/O unit 305 may communicate with the host processor directly via the interconnect 302 or through one or more intermediate devices such as a memory bridge. In an embodiment, the I/O unit 305 may communicate with one or more other processors, such as one or more the PPUs 300 via the interconnect 302. In an embodiment, the I/O unit 305 implements a Peripheral Component Interconnect Express (PCIe) interface for communications over a PCIe bus and the interconnect 302 is a PCIe bus. In alternative embodiments, the I/O unit 305 may implement other types of well-known interfaces for communicating with external devices.

The I/O unit 305 decodes packets received via the interconnect 302. In an embodiment, the packets represent commands configured to cause the PPU 300 to perform various operations. The I/O unit 305 transmits the decoded commands to various other units of the PPU 300 as the commands may specify. For example, some commands may be transmitted to the front end unit 315. Other commands may be transmitted to the hub 330 or other units of the PPU 300 such as one or more copy engines, a video encoder, a video decoder, a power management unit, etc. (not explicitly shown). In other words, the I/O unit 305 is configured to route communications between and among the various logical units of the PPU 300.

In an embodiment, a program executed by the host processor encodes a command stream in a buffer that provides workloads to the PPU 300 for processing. A workload may comprise several instructions and data to be processed by those instructions. The buffer is a region in a memory that is accessible (e.g., read/write) by both the host processor and the PPU 300. For example, the I/O unit 305 may be configured to access the buffer in a system memory connected to the interconnect 302 via memory requests transmitted over the interconnect 302. In an embodiment, the host processor writes the command stream to the buffer and then transmits a pointer to the start of the command stream to the PPU 300. The front end unit 315 receives pointers to one or more command streams. The front end unit 315 manages the one or more streams, reading commands from the streams and forwarding commands to the various units of the PPU 300.

The front end unit 315 is coupled to a scheduler unit 320 that configures the various GPCs 350 to process tasks defined by the one or more streams. The scheduler unit 320 is configured to track state information related to the various tasks managed by the scheduler unit 320. The state may indicate which GPC 350 a task is assigned to, whether the task is active or inactive, a priority level associated with the task, and so forth. The scheduler unit 320 manages the execution of a plurality of tasks on the one or more GPCs 350.

The scheduler unit 320 is coupled to a work distribution unit 325 that is configured to dispatch tasks for execution on the GPCs 350. The work distribution unit 325 may track a number of scheduled tasks received from the scheduler unit 320. In an embodiment, the work distribution unit 325 manages a pending task pool and an active task pool for each of the GPCs 350. The pending task pool may comprise a number of slots (e.g., 32 slots) that contain tasks assigned to be processed by a particular GPC 350. The active task pool may comprise a number of slots (e.g., 4 slots) for tasks that are actively being processed by the GPCs 350. As a GPC 350 finishes the execution of a task, that task is evicted from the active task pool for the GPC 350 and one of the other tasks from the pending task pool is selected and scheduled for execution on the GPC 350. If an active task has been idle on the GPC 350, such as while waiting for a data dependency to be resolved, then the active task may be evicted from the GPC 350 and returned to the pending task pool while another task in the pending task pool is selected and scheduled for execution on the GPC 350.

The work distribution unit 325 communicates with the one or more GPCs 350 via XBar 370. The XBar 370 is an interconnect network that couples many of the units of the PPU 300 to other units of the PPU 300. For example, the XBar 370 may be configured to couple the work distribution unit 325 to a particular GPC 350. Although not shown explicitly, one or more other units of the PPU 300 may also be connected to the XBar 370 via the hub 330.

The tasks are managed by the scheduler unit 320 and dispatched to a GPC 350 by the work distribution unit 325. The GPC 350 is configured to process the task and generate results. The results may be consumed by other tasks within the GPC 350, routed to a different GPC 350 via the XBar 370, or stored in the memory 304. The results can be written to the memory 304 via the memory partition units 380, which implement a memory interface for reading and writing data to/from the memory 304. The results can be transmitted to another PPU 300 or CPU via the NVLink 310. In an embodiment, the PPU 300 includes a number U of memory partition units 380 that is equal to the number of separate and distinct memory devices of the memory 304 coupled to the PPU 300. A memory partition unit 380 will be described in more detail below in conjunction with FIG. 4B.

In an embodiment, a host processor executes a driver kernel that implements an application programming interface (API) that enables one or more applications executing on the host processor to schedule operations for execution on the PPU 300. In an embodiment, multiple compute applications are simultaneously executed by the PPU 300 and the PPU 300 provides isolation, quality of service (QoS), and independent address spaces for the multiple compute applications. An application may generate instructions (e.g., API calls) that cause the driver kernel to generate one or more tasks for execution by the PPU 300. The driver kernel outputs tasks to one or more streams being processed by the PPU 300. Each task may comprise one or more groups of related threads, referred to herein as a warp. In an embodiment, a warp comprises 32 related threads that may be executed in parallel. Cooperating threads may refer to a plurality of threads including instructions to perform the task and that may exchange data through shared memory. Threads and cooperating threads are described in more detail in conjunction with FIG. 5A.

Figure 4A:
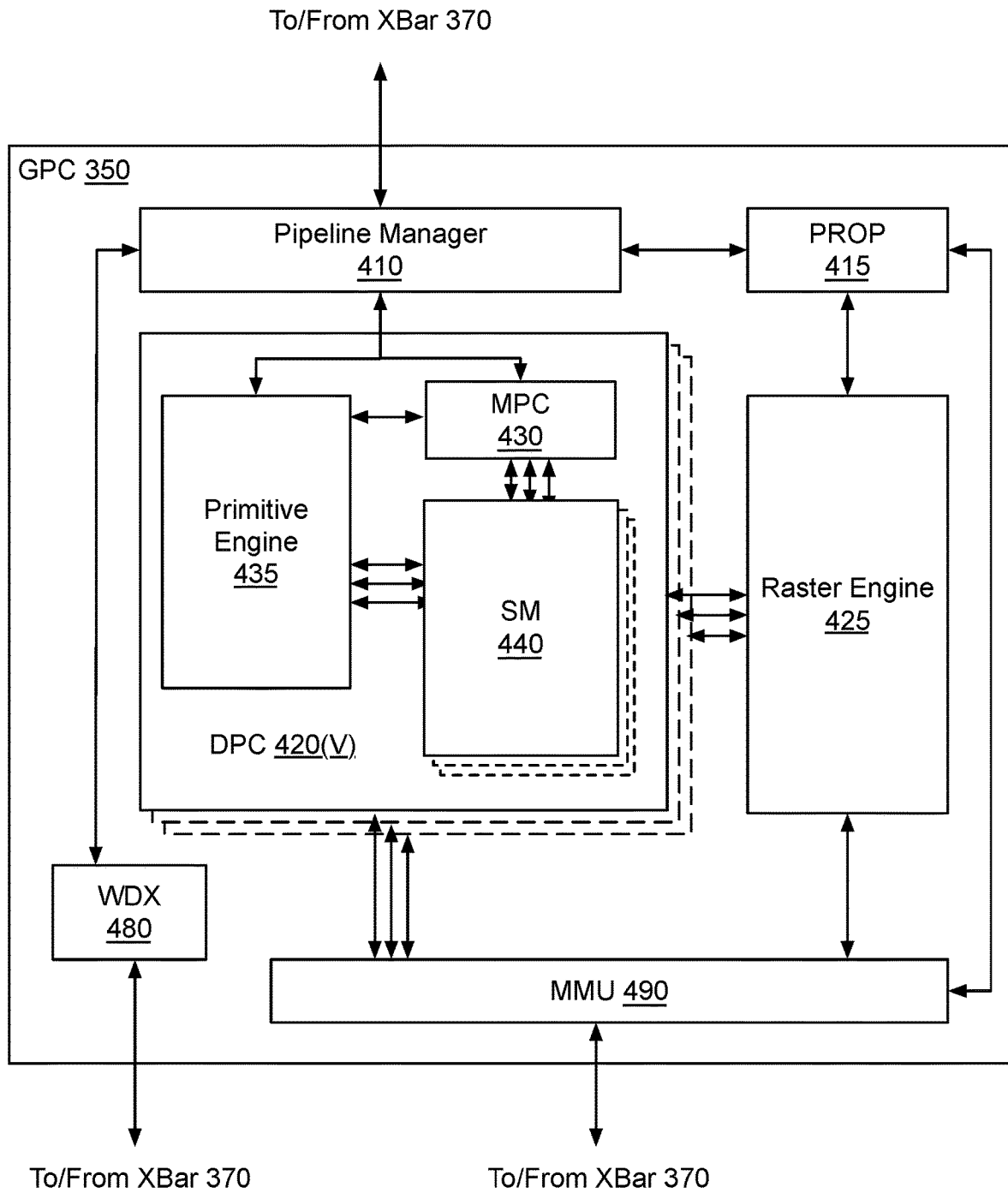
FIG. 4A illustrates an exemplary general processing cluster within the parallel processing unit of FIG. 3.

FIG. 4A illustrates a GPC 350 of the PPU 300 of FIG. 3, in accordance with an embodiment. As shown in FIG. 4A, each GPC 350 includes a number of hardware units for processing tasks. In an embodiment, each GPC 350 includes a pipeline manager 410, a pre-raster operations unit (PROP) 415, a raster engine 425, a work distribution crossbar (WDX) 480, a memory management unit (MMU) 490, and one or more Data Processing Clusters (DPCs) 420. It will be appreciated that the GPC 350 of FIG. 4A may include other hardware units in lieu of or in addition to the units shown in FIG. 4A.

In an embodiment, the operation of the GPC 350 is controlled by the pipeline manager 410. The pipeline manager 410 manages the configuration of the one or more DPCs 420 for processing tasks allocated to the GPC 350. In an embodiment, the pipeline manager 410 may configure at least one of the one or more DPCs 420 to implement at least a portion of a graphics rendering pipeline. For example, a DPC 420 may be configured to execute a vertex shader program on the programmable streaming multiprocessor (SM) 440. The pipeline manager 410 may also be configured to route packets received from the work distribution unit 325 to the appropriate logical units within the GPC 350. For example, some packets may be routed to fixed function hardware units in the PROP 415 and/or raster engine 425 while other packets may be routed to the DPCs 420 for processing by the primitive engine 435 or the SM 440. In an embodiment, the pipeline manager 410 may configure at least one of the one or more DPCs 420 to implement a neural network model and/or a computing pipeline.

Figure 4B:
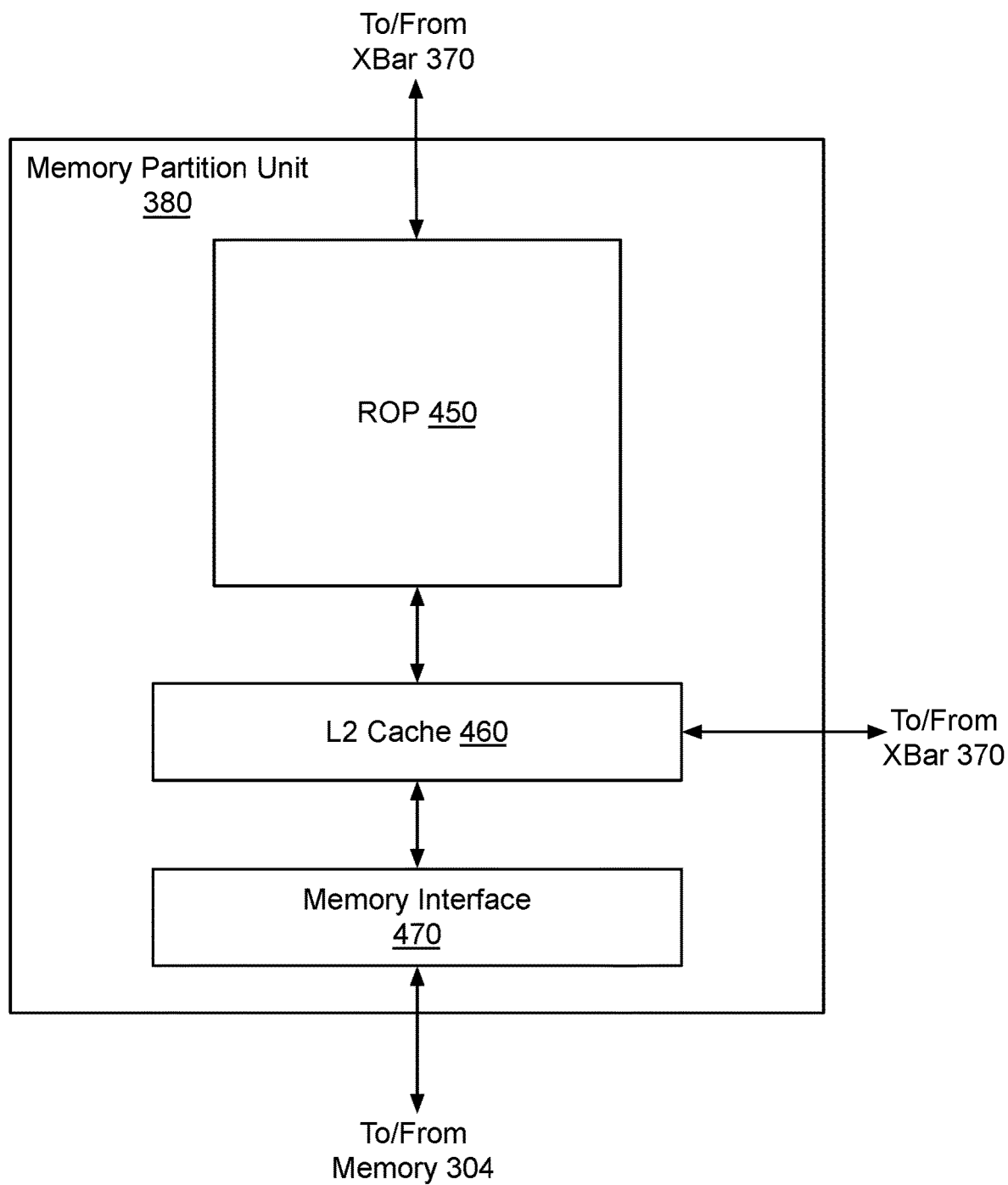
FIG. 4B illustrates an exemplary memory partition unit of the parallel processing unit of FIG. 3.

The PROP unit 415 is configured to route data generated by the raster engine 425 and the DPCs 420 to a Raster Operations (ROP) unit, described in more detail in conjunction with FIG. 4B. The PROP unit 415 may also be configured to perform optimizations for color blending, organize pixel data, perform address translations, and the like.

The raster engine 425 includes a number of fixed function hardware units configured to perform various raster operations. In an embodiment, the raster engine 425 includes a setup engine, a coarse raster engine, a culling engine, a clipping engine, a fine raster engine, and a tile coalescing engine. The setup engine receives transformed vertices and generates plane equations associated with the geometric primitive defined by the vertices. The plane equations are transmitted to the coarse raster engine to generate coverage information (e.g., an x,y coverage mask for a tile) for the primitive. The output of the coarse raster engine is transmitted to the culling engine where fragments associated with the primitive that fail a z-test are culled, and transmitted to a clipping engine where fragments lying outside a viewing frustum are clipped. Those fragments that survive clipping and culling may be passed to the fine raster engine to generate attributes for the pixel fragments based on the plane equations generated by the setup engine. The output of the raster engine 425 comprises fragments to be processed, for example, by a fragment shader implemented within a DPC 420.

Each DPC 420 included in the GPC 350 includes an M-Pipe Controller (MPC) 430, a primitive engine 435, and one or more SMs 440. The MPC 430 controls the operation of the DPC 420, routing packets received from the pipeline manager 410 to the appropriate units in the DPC 420. For example, packets associated with a vertex may be routed to the primitive engine 435, which is configured to fetch vertex attributes associated with the vertex from the memory 304. In contrast, packets associated with a shader program may be transmitted to the SM 440.

The SM 440 comprises a programmable streaming processor that is configured to process tasks represented by a number of threads. Each SM 440 is multi-threaded and configured to execute a plurality of threads (e.g., 32 threads) from a particular group of threads concurrently. In an embodiment, the SM 440 implements a SIMD (Single-Instruction, Multiple-Data) architecture where each thread in a group of threads (e.g., a warp) is configured to process a different set of data based on the same set of instructions. All threads in the group of threads execute the same instructions. In another embodiment, the SM 440 implements a SIMT (Single-Instruction, Multiple Thread) architecture where each thread in a group of threads is configured to process a different set of data based on the same set of instructions, but where individual threads in the group of threads are allowed to diverge during execution. In an embodiment, a program counter, call stack, and execution state is maintained for each warp, enabling concurrency between warps and serial execution within warps when threads within the warp diverge. In another embodiment, a program counter, call stack, and execution state is maintained for each individual thread, enabling equal concurrency between all threads, within and between warps. When execution state is maintained for each individual thread, threads executing the same instructions may be converged and executed in parallel for maximum efficiency. The SM 440 will be described in more detail below in conjunction with FIG. 5A.

The MMU 490 provides an interface between the GPC 350 and the memory partition unit 380. The MMU 490 may provide translation of virtual addresses into physical addresses, memory protection, and arbitration of memory requests. In an embodiment, the MMU 490 provides one or more translation lookaside buffers (TLBs) for performing translation of virtual addresses into physical addresses in the memory 304.

FIG. 4B illustrates a memory partition unit 380 of the PPU 300 of FIG. 3, in accordance with an embodiment. As shown in FIG. 4B, the memory partition unit 380 includes a Raster Operations (ROP) unit 450, a level two (L2) cache 460, and a memory interface 470. The memory interface 470 is coupled to the memory 304. Memory interface 470 may implement 32, 64, 128, 1024-bit data buses, or the like, for high-speed data transfer. In an embodiment, the PPU 300 incorporates U memory interfaces 470, one memory interface 470 per pair of memory partition units 380, where each pair of memory partition units 380 is connected to a corresponding memory device of the memory 304. For example, PPU 300 may be connected to up to Y memory devices, such as high bandwidth memory stacks or graphics double-data-rate, version 5, synchronous dynamic random access memory, or other types of persistent storage.

In an embodiment, the memory interface 470 implements an HBM2 memory interface and Y equals half U. In an embodiment, the HBM2 memory stacks are located on the same physical package as the PPU 300, providing substantial power and area savings compared with conventional GDDR5 SDRAM systems. In an embodiment, each HBM2 stack includes four memory dies and Y equals 4, with HBM2 stack including two 128-bit channels per die for a total of 8 channels and a data bus width of 1024 bits.

In an embodiment, the memory 304 supports Single-Error Correcting Double-Error Detecting (SECDED) Error Correction Code (ECC) to protect data. ECC provides higher reliability for compute applications that are sensitive to data corruption. Reliability is especially important in large-scale cluster computing environments where PPUs 300 process very large datasets and/or run applications for extended periods.

In an embodiment, the PPU 300 implements a multi-level memory hierarchy. In an embodiment, the memory partition unit 380 supports a unified memory to provide a single unified virtual address space for CPU and PPU 300 memory, enabling data sharing between virtual memory systems. In an embodiment the frequency of accesses by a PPU 300 to memory located on other processors is traced to ensure that memory pages are moved to the physical memory of the PPU 300 that is accessing the pages more frequently. In an embodiment, the NVLink 310 supports address translation services allowing the PPU 300 to directly access a CPU's page tables and providing full access to CPU memory by the PPU 300.

In an embodiment, copy engines transfer data between multiple PPUs 300 or between PPUs 300 and CPUs. The copy engines can generate page faults for addresses that are not mapped into the page tables. The memory partition unit 380 can then service the page faults, mapping the addresses into the page table, after which the copy engine can perform the transfer. In a conventional system, memory is pinned (e.g., non-pageable) for multiple copy engine operations between multiple processors, substantially reducing the available memory. With hardware page faulting, addresses can be passed to the copy engines without worrying if the memory pages are resident, and the copy process is transparent.

Data from the memory 304 or other system memory may be fetched by the memory partition unit 380 and stored in the L2 cache 460, which is located on-chip and is shared between the various GPCs 350. As shown, each memory partition unit 380 includes a portion of the L2 cache 460 associated with a corresponding memory 304. Lower level caches may then be implemented in various units within the GPCs 350. For example, each of the SMs 440 may implement a level one (L1) cache. The L1 cache is private memory that is dedicated to a particular SM 440. Data from the L2 cache 460 may be fetched and stored in each of the L1 caches for processing in the functional units of the SMs 440. The L2 cache 460 is coupled to the memory interface 470 and the XBar 370.

The ROP unit 450 performs graphics raster operations related to pixel color, such as color compression, pixel blending, and the like. The ROP unit 450 also implements depth testing in conjunction with the raster engine 425, receiving a depth for a sample location associated with a pixel fragment from the culling engine of the raster engine 425. The depth is tested against a corresponding depth in a depth buffer for a sample location associated with the fragment. If the fragment passes the depth test for the sample location, then the ROP unit 450 updates the depth buffer and transmits a result of the depth test to the raster engine 425. It will be appreciated that the number of memory partition units 380 may be different than the number of GPCs 350 and, therefore, each ROP unit 450 may be coupled to each of the GPCs 350. The ROP unit 450 tracks packets received from the different GPCs 350 and determines which GPC 350 that a result generated by the ROP unit 450 is routed to through the Xbar 370. Although the ROP unit 450 is included within the memory partition unit 380 in FIG. 4B, in other embodiment, the ROP unit 450 may be outside of the memory partition unit 380. For example, the ROP unit 450 may reside in the GPC 350 or another unit.

Figure 5A:
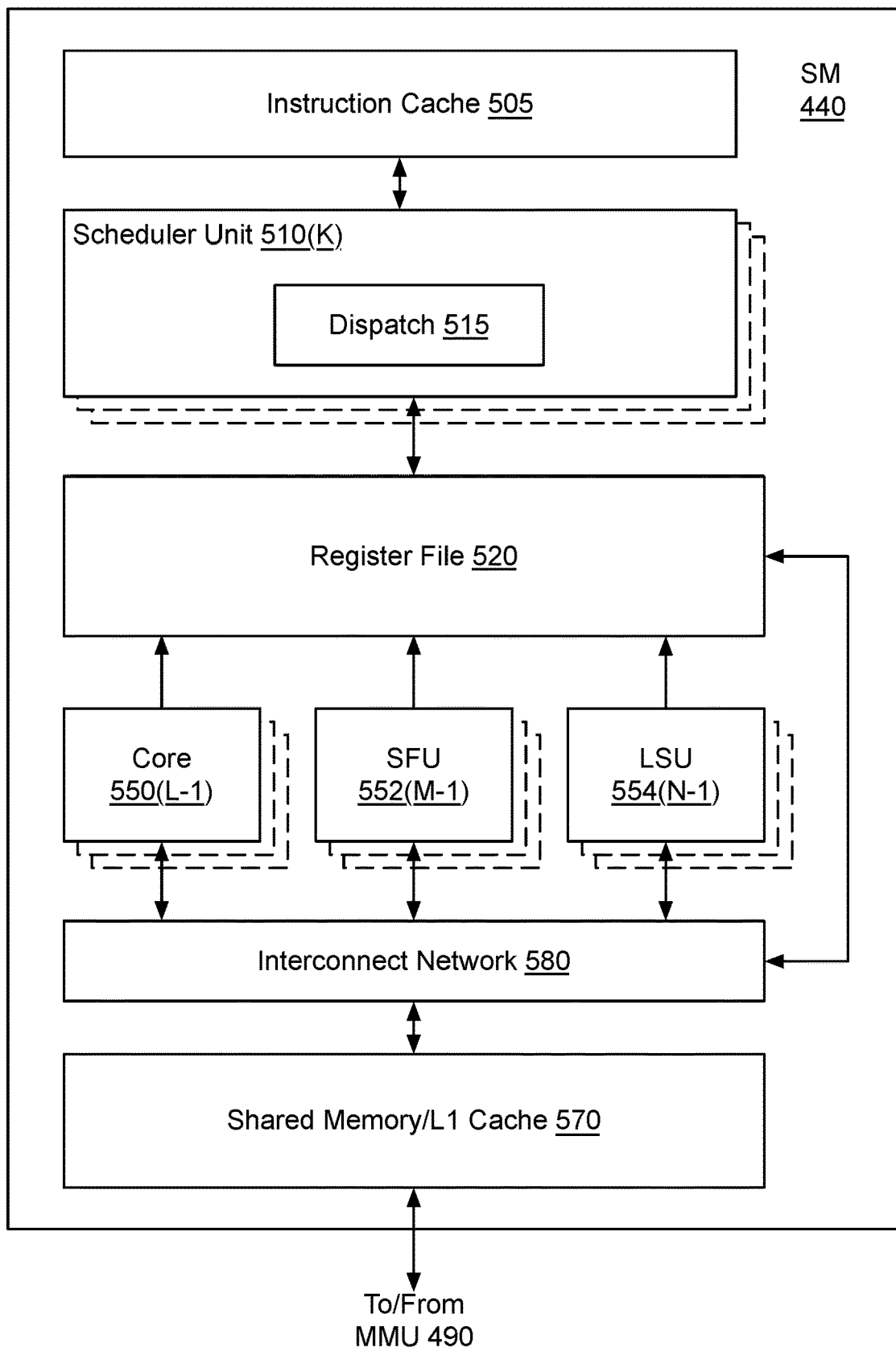
FIG. 5A illustrates an exemplary streaming multi-processor of FIG. 4A.

FIG. 5A illustrates the streaming multi-processor 440 of FIG. 4A, in accordance with an embodiment. As shown in FIG. 5A, the SM 440 includes an instruction cache 505, one or more scheduler units 510, a register file 520, one or more processing cores 550, one or more special function units (SFUs) 552, one or more load/store units (LSUs) 554, an interconnect network 580, a shared memory/L1 cache 570.

As described above, the work distribution unit 325 dispatches tasks for execution on the GPCs 350 of the PPU 300. The tasks are allocated to a particular DPC 420 within a GPC 350 and, if the task is associated with a shader program, the task may be allocated to an SM 440. The scheduler unit 510 receives the tasks from the work distribution unit 325 and manages instruction scheduling for one or more thread blocks assigned to the SM 440. The scheduler unit 510 schedules thread blocks for execution as warps of parallel threads, where each thread block is allocated at least one warp. In an embodiment, each warp executes 32 threads. The scheduler unit 510 may manage a plurality of different thread blocks, allocating the warps to the different thread blocks and then dispatching instructions from the plurality of different cooperative groups to the various functional units (e.g., cores 550, SFUs 552, and LSUs 554) during each clock cycle.

Cooperative Groups is a programming model for organizing groups of communicating threads that allows developers to express the granularity at which threads are communicating, enabling the expression of richer, more efficient parallel decompositions. Cooperative launch APIs support synchronization amongst thread blocks for the execution of parallel algorithms. Conventional programming models provide a single, simple construct for synchronizing cooperating threads: a barrier across all threads of a thread block (e.g., the syncthreads( ) function). However, programmers would often like to define groups of threads at smaller than thread block granularities and synchronize within the defined groups to enable greater performance, design flexibility, and software reuse in the form of collective group-wide function interfaces.

Cooperative Groups enables programmers to define groups of threads explicitly at sub-block (e.g., as small as a single thread) and multi-block granularities, and to perform collective operations such as synchronization on the threads in a cooperative group. The programming model supports clean composition across software boundaries, so that libraries and utility functions can synchronize safely within their local context without having to make assumptions about convergence. Cooperative Groups primitives enable new patterns of cooperative parallelism, including producer-consumer parallelism, opportunistic parallelism, and global synchronization across an entire grid of thread blocks.

A dispatch unit 515 is configured to transmit instructions to one or more of the functional units. In the embodiment, the scheduler unit 510 includes two dispatch units 515 that enable two different instructions from the same warp to be dispatched during each clock cycle. In alternative embodiments, each scheduler unit 510 may include a single dispatch unit 515 or additional dispatch units 515.

Each SM 440 includes a register file 520 that provides a set of registers for the functional units of the SM 440. In an embodiment, the register file 520 is divided between each of the functional units such that each functional unit is allocated a dedicated portion of the register file 520. In another embodiment, the register file 520 is divided between the different warps being executed by the SM 440. The register file 520 provides temporary storage for operands connected to the data paths of the functional units.

Each SM 440 comprises L processing cores 550. In an embodiment, the SM 440 includes a large number (e.g., 128, etc.) of distinct processing cores 550. Each core 550 may include a fully-pipelined, single-precision, double-precision, and/or mixed precision processing unit that includes a floating point arithmetic logic unit and an integer arithmetic logic unit. In an embodiment, the floating point arithmetic logic units implement the IEEE 754-2008 standard for floating point arithmetic. In an embodiment, the cores 550 include 64 single-precision (32-bit) floating point cores, 64 integer cores, 32 double-precision (64-bit) floating point cores, and 8 tensor cores.

Tensor cores configured to perform matrix operations, and, in an embodiment, one or more tensor cores are included in the cores 550. In particular, the tensor cores are configured to perform deep learning matrix arithmetic, such as convolution operations for neural network training and inferencing. In an embodiment, each tensor core operates on a 4×4 matrix and performs a matrix multiply and accumulate operation $D=A\times B+C$, where A, B, C, and D are 4×4 matrices.

In an embodiment, the matrix multiply inputs A and B are 16-bit floating point matrices, while the accumulation matrices C and D may be 16-bit floating point or 32-bit floating point matrices. Tensor Cores operate on 16-bit floating point input data with 32-bit floating point accumulation. The 16-bit floating point multiply requires 64 operations and results in a full precision product that is then accumulated using 32-bit floating point addition with the other intermediate products for a 4×4×4 matrix multiply. In practice, Tensor Cores are used to perform much larger two-dimensional or higher dimensional matrix operations, built up from these smaller elements. An API, such as CUDA 9 C++ API, exposes specialized matrix load, matrix multiply and accumulate, and matrix store operations to efficiently use Tensor Cores from a CUDA-C++ program. At the CUDA level, the warp-level interface assumes 16×16 size matrices spanning all 32 threads of the warp.

Each SM 440 also comprises M SFUs 552 that perform special functions (e.g., attribute evaluation, reciprocal square root, and the like). In an embodiment, the SFUs 552 may include a tree traversal unit configured to traverse a hierarchical tree data structure. In an embodiment, the SFUs 552 may include texture unit configured to perform texture map filtering operations. In an embodiment, the texture units are configured to load texture maps (e.g., a 2D array of texels) from the memory 304 and sample the texture maps to produce sampled texture values for use in shader programs executed by the SM 440. In an embodiment, the texture maps are stored in the shared memory/L1 cache 570. The texture units implement texture operations such as filtering operations using mip-maps (e.g., texture maps of varying levels of detail). In an embodiment, each SM 340 includes two texture units.

Each SM 440 also comprises N LSUs 554 that implement load and store operations between the shared memory/L1 cache 570 and the register file 520. Each SM 440 includes an interconnect network 580 that connects each of the functional units to the register file 520 and the LSU 554 to the register file 520, shared memory/L1 cache 570. In an embodiment, the interconnect network 580 is a crossbar that can be configured to connect any of the functional units to any of the registers in the register file 520 and connect the LSUs 554 to the register file and memory locations in shared memory/L1 cache 570.

The shared memory/L1 cache 570 is an array of on-chip memory that allows for data storage and communication between the SM 440 and the primitive engine 435 and between threads in the SM 440. In an embodiment, the shared memory/L1 cache 570 comprises 128 KB of storage capacity and is in the path from the SM 440 to the memory partition unit 380. The shared memory/L1 cache 570 can be used to cache reads and writes. One or more of the shared memory/L1 cache 570, L2 cache 460, and memory 304 are backing stores.

Combining data cache and shared memory functionality into a single memory block provides the best overall performance for both types of memory accesses. The capacity is usable as a cache by programs that do not use shared memory. For example, if shared memory is configured to use half of the capacity, texture and load/store operations can use the remaining capacity. Integration within the shared memory/L1 cache 570 enables the shared memory/L1 cache 570 to function as a high-throughput conduit for streaming data while simultaneously providing high-bandwidth and low-latency access to frequently reused data.

When configured for general purpose parallel computation, a simpler configuration can be used compared with graphics processing. Specifically, the fixed function graphics processing units shown in FIG. 3, are bypassed, creating a much simpler programming model. In the general purpose parallel computation configuration, the work distribution unit 325 assigns and distributes blocks of threads directly to the DPCs 420. The threads in a block execute the same program, using a unique thread ID in the calculation to ensure each thread generates unique results, using the SM 440 to execute the program and perform calculations, shared memory/L1 cache 570 to communicate between threads, and the LSU 554 to read and write global memory through the shared memory/L1 cache 570 and the memory partition unit 380. When configured for general purpose parallel computation, the SM 440 can also write commands that the scheduler unit 320 can use to launch new work on the DPCs 420.

The PPU 300 may be included in a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, and the like.

In an embodiment, the PPU 300 is embodied on a single semiconductor substrate. In another embodiment, the PPU 300 is included in a system-on-a-chip (SoC) along with one or more other devices such as additional PPUs 300, the memory 304, a reduced instruction set computer (RISC) CPU, a memory management unit (MMU), a digital-to-analog converter (DAC), and the like.

In an embodiment, the PPU 300 may be included on a graphics card that includes one or more memory devices. The graphics card may be configured to interface with a PCIe slot on a motherboard of a desktop computer. In yet another embodiment, the PPU 300 may be an integrated graphics processing unit (iGPU) or parallel processor included in the chipset of the motherboard.

Exemplary Computing System

Systems with multiple GPUs and CPUs are used in a variety of industries as developers expose and leverage more parallelism in applications such as artificial intelligence computing. High-performance GPU-accelerated systems with tens to many thousands of compute nodes are deployed in data centers, research facilities, and supercomputers to solve ever larger problems. As the number of processing devices within the high-performance systems increases, the communication and data transfer mechanisms need to scale to support the increased bandwidth.

Figure 5B:
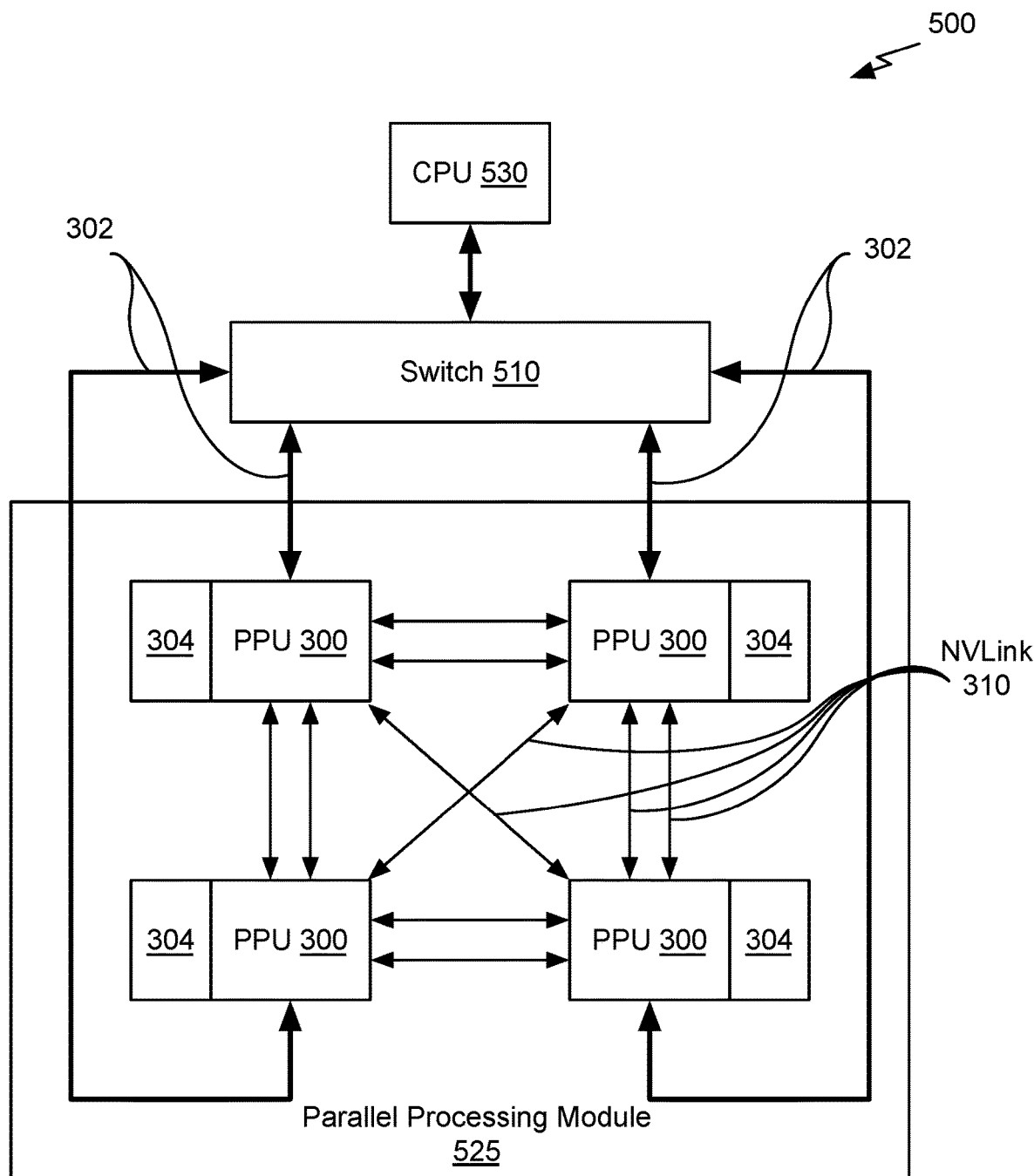
FIG. 5B illustrates an exemplary diagram of a processing system implemented using the PPU of FIG. 3.

FIG. 5B is a conceptual diagram of a processing system 500 implemented using the PPU 300 of FIG. 3, in accordance with an embodiment. The exemplary system 565 may be configured to implement the method 110 shown in FIG. 1B, the method 165 shown in FIG. 1D, the method 200 shown in FIG. 2A, and/or the method 250 shown in FIG. 2B. The processing system 500 includes a CPU 530, switch 510, and multiple PPUs 300, and respective memories 304. The NVLink 310 provides high-speed communication links between each of the PPUs 300. Although a particular number of NVLink 310 and interconnect 302 connections are illustrated in FIG. 5B, the number of connections to each PPU 300 and the CPU 530 may vary. The switch 510 interfaces between the interconnect 302 and the CPU 530. The PPUs 300, memories 304, and NVLinks 310 may be situated on a single semiconductor platform to form a parallel processing module 525. In an embodiment, the switch 510 supports two or more protocols to interface between various different connections and/or links.

In another embodiment (not shown), the NVLink 310 provides one or more high-speed communication links between each of the PPUs 300 and the CPU 530 and the switch 510 interfaces between the interconnect 302 and each of the PPUs 300. The PPUs 300, memories 304, and interconnect 302 may be situated on a single semiconductor platform to form a parallel processing module 525. In yet another embodiment (not shown), the interconnect 302 provides one or more communication links between each of the PPUs 300 and the CPU 530 and the switch 510 interfaces between each of the PPUs 300 using the NVLink 310 to provide one or more high-speed communication links between the PPUs 300. In another embodiment (not shown), the NVLink 310 provides one or more high-speed communication links between the PPUs 300 and the CPU 530 through the switch 510. In yet another embodiment (not shown), the interconnect 302 provides one or more communication links between each of the PPUs 300 directly. One or more of the NVLink 310 high-speed communication links may be implemented as a physical NVLink interconnect or either an on-chip or on-die interconnect using the same protocol as the NVLink 310.

In the context of the present description, a single semiconductor platform may refer to a sole unitary semiconductor-based integrated circuit fabricated on a die or chip. It should be noted that the term single semiconductor platform may also refer to multi-chip modules with increased connectivity which simulate on-chip operation and make substantial improvements over utilizing a conventional bus implementation. Of course, the various circuits or devices may also be situated separately or in various combinations of semiconductor platforms per the desires of the user. Alternately, the parallel processing module 525 may be implemented as a circuit board substrate and each of the PPUs 300 and/or memories 304 may be packaged devices. In an embodiment, the CPU 530, switch 510, and the parallel processing module 525 are situated on a single semiconductor platform.

In an embodiment, the signaling rate of each NVLink 310 is 20 to 25 Gigabits/second and each PPU 300 includes six NVLink 310 interfaces (as shown in FIG. 5B, five NVLink 310 interfaces are included for each PPU 300). Each NVLink 310 provides a data transfer rate of 25 Gigabytes/second in each direction, with six links providing 300 Gigabytes/second. The NVLinks 310 can be used exclusively for PPU-to-PPU communication as shown in FIG. 5B, or some combination of PPU-to-PPU and PPU-to-CPU, when the CPU 530 also includes one or more NVLink 310 interfaces.

In an embodiment, the NVLink 310 allows direct load/store/atomic access from the CPU 530 to each PPU's 300 memory 304. In an embodiment, the NVLink 310 supports coherency operations, allowing data read from the memories 304 to be stored in the cache hierarchy of the CPU 530, reducing cache access latency for the CPU 530. In an embodiment, the NVLink 310 includes support for Address Translation Services (ATS), allowing the PPU 300 to directly access page tables within the CPU 530. One or more of the NVLinks 310 may also be configured to operate in a low-power mode.

Figure 5C:
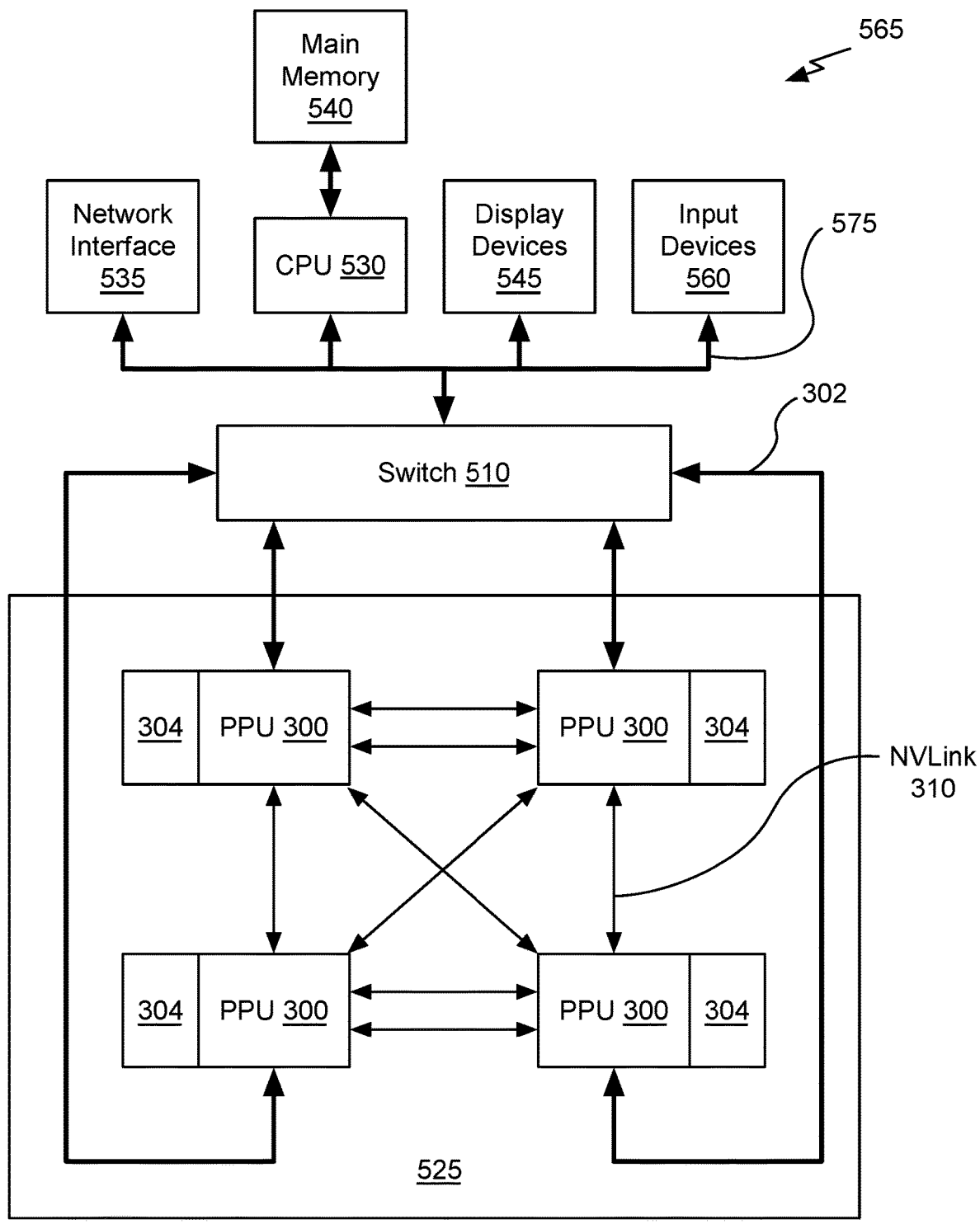
FIG. 5C illustrates an exemplary system in which the various architecture and/or functionality of the various previous embodiments may be implemented.

FIG. 5C illustrates an exemplary system 565 in which the various architecture and/or functionality of the various previous embodiments may be implemented. The exemplary system 565 may be configured to implement the method 110 shown in FIG. 1B, the method 165 shown in FIG. 1D, the method 200 shown in FIG. 2A, and/or the method 250 shown in FIG. 2B.

As shown, a system 565 is provided including at least one central processing unit 530 that is connected to a communication bus 575. The communication bus 575 may be implemented using any suitable protocol, such as PCI (Peripheral Component Interconnect), PCI-Express, AGP (Accelerated Graphics Port), HyperTransport, or any other bus or point-to-point communication protocol(s). The system 565 also includes a main memory 540. Control logic (software) and data are stored in the main memory 540 which may take the form of random access memory (RAM).

The system 565 also includes input devices 560, the parallel processing system 525, and display devices 545, e.g. a conventional CRT (cathode ray tube), LCD (liquid crystal display), LED (light emitting diode), plasma display or the like. User input may be received from the input devices 560, e.g., keyboard, mouse, touchpad, microphone, and the like. Each of the foregoing modules and/or devices may even be situated on a single semiconductor platform to form the system 565. Alternately, the various modules may also be situated separately or in various combinations of semiconductor platforms per the desires of the user.

Further, the system 565 may be coupled to a network (e.g., a telecommunications network, local area network (LAN), wireless network, wide area network (WAN) such as the Internet, peer-to-peer network, cable network, or the like) through a network interface 535 for communication purposes.

The system 565 may also include a secondary storage (not shown). The secondary storage 610 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 540 and/or the secondary storage. Such computer programs, when executed, enable the system 565 to perform various functions. The memory 540, the storage, and/or any other storage are possible examples of computer-readable media.

The architecture and/or functionality of the various previous figures may be implemented in the context of a general computer system, a circuit board system, a game console system dedicated for entertainment purposes, an application-specific system, and/or any other desired system. For example, the system 565 may take the form of a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, a mobile phone device, a television, workstation, game consoles, embedded system, and/or any other type of logic.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Graphics Processing Pipeline

In an embodiment, the PPU 300 comprises a graphics processing unit (GPU). The PPU 300 is configured to receive commands that specify shader programs for processing graphics data. Graphics data may be defined as a set of primitives such as points, lines, triangles, quads, triangle strips, and the like. Typically, a primitive includes data that specifies a number of vertices for the primitive (e.g., in a model-space coordinate system) as well as attributes associated with each vertex of the primitive. The PPU 300 can be configured to process the graphics primitives to generate a frame buffer (e.g., pixel data for each of the pixels of the display).

An application writes model data for a scene (e.g., a collection of vertices and attributes) to a memory such as a system memory or memory 304. The model data defines each of the objects that may be visible on a display. The application then makes an API call to the driver kernel that requests the model data to be rendered and displayed. The driver kernel reads the model data and writes commands to the one or more streams to perform operations to process the model data. The commands may reference different shader programs to be implemented on the SMs 440 of the PPU 300 including one or more of a vertex shader, hull shader, domain shader, geometry shader, and a pixel shader. For example, one or more of the SMs 440 may be configured to execute a vertex shader program that processes a number of vertices defined by the model data. In an embodiment, the different SMs 440 may be configured to execute different shader programs concurrently. For example, a first subset of SMs 440 may be configured to execute a vertex shader program while a second subset of SMs 440 may be configured to execute a pixel shader program. The first subset of SMs 440 processes vertex data to produce processed vertex data and writes the processed vertex data to the L2 cache 460 and/or the memory 304. After the processed vertex data is rasterized (e.g., transformed from three-dimensional data into two-dimensional data in screen space) to produce fragment data, the second subset of SMs 440 executes a pixel shader to produce processed fragment data, which is then blended with other processed fragment data and written to the frame buffer in memory 304. The vertex shader program and pixel shader program may execute concurrently, processing different data from the same scene in a pipelined fashion until all of the model data for the scene has been rendered to the frame buffer. Then, the contents of the frame buffer are transmitted to a display controller for display on a display device.

Figure 6:
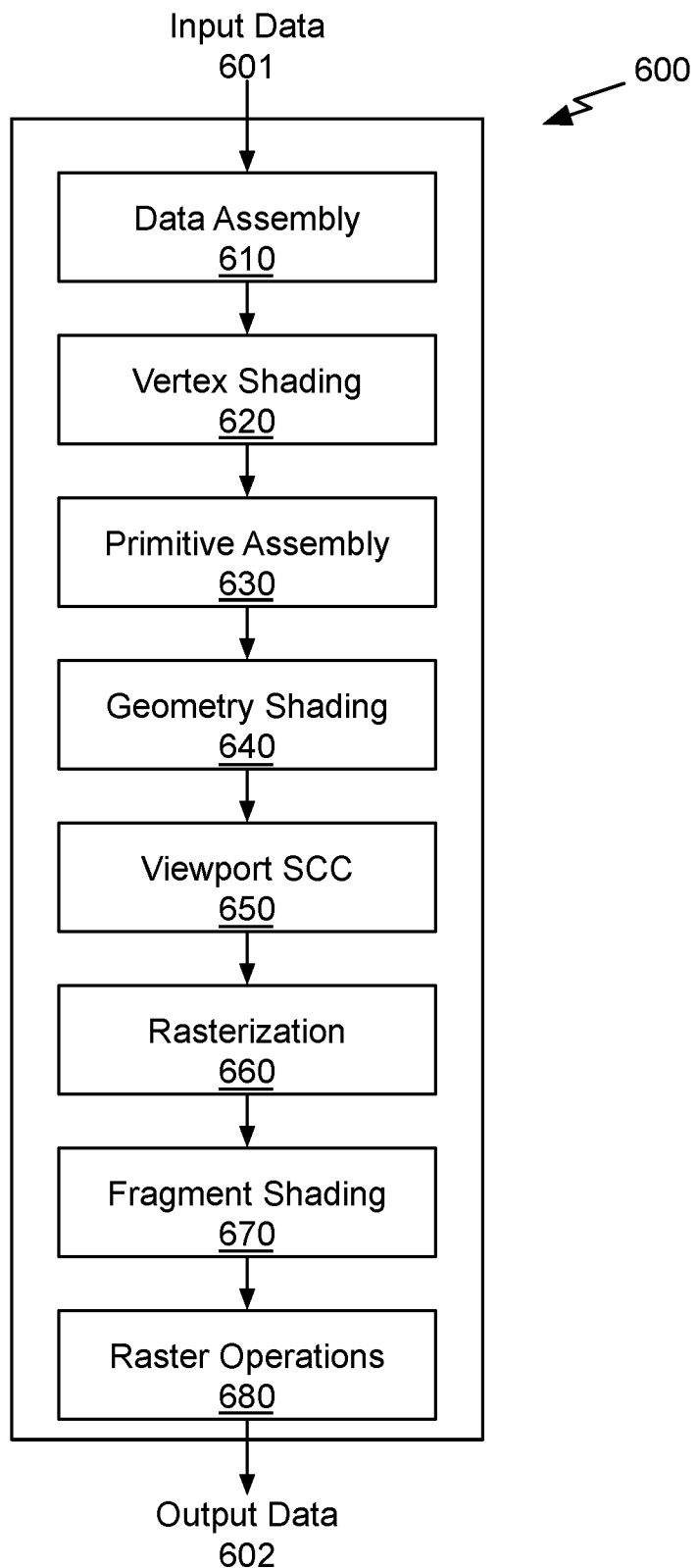
FIG. 6 illustrates an exemplary diagram of a graphics processing pipeline implemented by the PPU of FIG. 3.

FIG. 6 is a conceptual diagram of a graphics processing pipeline 600 implemented by the PPU 300 of FIG. 3, in accordance with an embodiment. The graphics processing pipeline 600 is an abstract flow diagram of the processing steps implemented to generate 2D computer-generated images from 3D geometry data. As is well-known, pipeline architectures may perform long latency operations more efficiently by splitting up the operation into a plurality of stages, where the output of each stage is coupled to the input of the next successive stage. Thus, the graphics processing pipeline 600 receives input data 601 that is transmitted from one stage to the next stage of the graphics processing pipeline 600 to generate output data 602. In an embodiment, the graphics processing pipeline 600 may represent a graphics processing pipeline defined by the OpenGL® API. As an option, the graphics processing pipeline 600 may be implemented in the context of the functionality and architecture of the previous Figures and/or any subsequent Figure(s).

As shown in FIG. 6, the graphics processing pipeline 600 comprises a pipeline architecture that includes a number of stages. The stages include, but are not limited to, a data assembly stage 610, a vertex shading stage 620, a primitive assembly stage 630, a geometry shading stage 640, a viewport scale, cull, and clip (VSCC) stage 650, a rasterization stage 660, a fragment shading stage 670, and a raster operations stage 680. In an embodiment, the input data 601 comprises commands that configure the processing units to implement the stages of the graphics processing pipeline 600 and geometric primitives (e.g., points, lines, triangles, quads, triangle strips or fans, etc.) to be processed by the stages. The output data 602 may comprise pixel data (e.g., color data) that is copied into a frame buffer or other type of surface data structure in a memory.

The data assembly stage 610 receives the input data 601 that specifies vertex data for high-order surfaces, primitives, or the like. The data assembly stage 610 collects the vertex data in a temporary storage or queue, such as by receiving a command from the host processor that includes a pointer to a buffer in memory and reading the vertex data from the buffer. The vertex data is then transmitted to the vertex shading stage 620 for processing.

The vertex shading stage 620 processes vertex data by performing a set of operations (e.g., a vertex shader or a program) once for each of the vertices. Vertices may be, e.g., specified as a 4-coordinate vector (e.g., <x, y, z, w>) associated with one or more vertex attributes (e.g., color, texture coordinates, surface normal, etc.). The vertex shading stage 620 may manipulate individual vertex attributes such as position, color, texture coordinates, and the like. In other words, the vertex shading stage 620 performs operations on the vertex coordinates or other vertex attributes associated with a vertex. Such operations commonly including lighting operations (e.g., modifying color attributes for a vertex) and transformation operations (e.g., modifying the coordinate space for a vertex). For example, vertices may be specified using coordinates in an object-coordinate space, which are transformed by multiplying the coordinates by a matrix that translates the coordinates from the object-coordinate space into a world space or a normalized-device-coordinate (NCD) space. The vertex shading stage 620 generates transformed vertex data that is transmitted to the primitive assembly stage 630.

The primitive assembly stage 630 collects vertices output by the vertex shading stage 620 and groups the vertices into geometric primitives for processing by the geometry shading stage 640. For example, the primitive assembly stage 630 may be configured to group every three consecutive vertices as a geometric primitive (e.g., a triangle) for transmission to the geometry shading stage 640. In some embodiments, specific vertices may be reused for consecutive geometric primitives (e.g., two consecutive triangles in a triangle strip may share two vertices). The primitive assembly stage 630 transmits geometric primitives (e.g., a collection of associated vertices) to the geometry shading stage 640.

The geometry shading stage 640 processes geometric primitives by performing a set of operations (e.g., a geometry shader or program) on the geometric primitives. Tessellation operations may generate one or more geometric primitives from each geometric primitive. In other words, the geometry shading stage 640 may subdivide each geometric primitive into a finer mesh of two or more geometric primitives for processing by the rest of the graphics processing pipeline 600. The geometry shading stage 640 transmits geometric primitives to the viewport SCC stage 650.

In an embodiment, the graphics processing pipeline 600 may operate within a streaming multiprocessor and the vertex shading stage 620, the primitive assembly stage 630, the geometry shading stage 640, the fragment shading stage 670, and/or hardware/software associated therewith, may sequentially perform processing operations. Once the sequential processing operations are complete, in an embodiment, the viewport SCC stage 650 may utilize the data. In an embodiment, primitive data processed by one or more of the stages in the graphics processing pipeline 600 may be written to a cache (e.g. L1 cache, a vertex cache, etc.). In this case, in an embodiment, the viewport SCC stage 650 may access the data in the cache. In an embodiment, the viewport SCC stage 650 and the rasterization stage 660 are implemented as fixed function circuitry.

The viewport SCC stage 650 performs viewport scaling, culling, and clipping of the geometric primitives. Each surface being rendered to is associated with an abstract camera position. The camera position represents a location of a viewer looking at the scene and defines a viewing frustum that encloses the objects of the scene. The viewing frustum may include a viewing plane, a rear plane, and four clipping planes. Any geometric primitive entirely outside of the viewing frustum may be culled (e.g., discarded) because the geometric primitive will not contribute to the final rendered scene. Any geometric primitive that is partially inside the viewing frustum and partially outside the viewing frustum may be clipped (e.g., transformed into a new geometric primitive that is enclosed within the viewing frustum. Furthermore, geometric primitives may each be scaled based on a depth of the viewing frustum. All potentially visible geometric primitives are then transmitted to the rasterization stage 660.

The rasterization stage 660 converts the 3D geometric primitives into 2D fragments (e.g. capable of being utilized for display, etc.). The rasterization stage 660 may be configured to utilize the vertices of the geometric primitives to setup a set of plane equations from which various attributes can be interpolated. The rasterization stage 660 may also compute a coverage mask for a plurality of pixels that indicates whether one or more sample locations for the pixel intercept the geometric primitive. In an embodiment, z-testing may also be performed to determine if the geometric primitive is occluded by other geometric primitives that have already been rasterized. The rasterization stage 660 generates fragment data (e.g., interpolated vertex attributes associated with a particular sample location for each covered pixel) that are transmitted to the fragment shading stage 670.

The fragment shading stage 670 processes fragment data by performing a set of operations (e.g., a fragment shader or a program) on each of the fragments. The fragment shading stage 670 may generate pixel data (e.g., color values) for the fragment such as by performing lighting operations or sampling texture maps using interpolated texture coordinates for the fragment. The fragment shading stage 670 generates pixel data that is transmitted to the raster operations stage 680.

The raster operations stage 680 may perform various operations on the pixel data such as performing alpha tests, stencil tests, and blending the pixel data with other pixel data corresponding to other fragments associated with the pixel. When the raster operations stage 680 has finished processing the pixel data (e.g., the output data 602), the pixel data may be written to a render target such as a frame buffer, a color buffer, or the like.

It will be appreciated that one or more additional stages may be included in the graphics processing pipeline 600 in addition to or in lieu of one or more of the stages described above. Various implementations of the abstract graphics processing pipeline may implement different stages. Furthermore, one or more of the stages described above may be excluded from the graphics processing pipeline in some embodiments (such as the geometry shading stage 640). Other types of graphics processing pipelines are contemplated as being within the scope of the present disclosure. Furthermore, any of the stages of the graphics processing pipeline 600 may be implemented by one or more dedicated hardware units within a graphics processor such as PPU 300. Other stages of the graphics processing pipeline 600 may be implemented by programmable hardware units such as the SM 440 of the PPU 300.

The graphics processing pipeline 600 may be implemented via an application executed by a host processor, such as a CPU. In an embodiment, a device driver may implement an application programming interface (API) that defines various functions that can be utilized by an application in order to generate graphical data for display. The device driver is a software program that includes a plurality of instructions that control the operation of the PPU 300. The API provides an abstraction for a programmer that lets a programmer utilize specialized graphics hardware, such as the PPU 300, to generate the graphical data without requiring the programmer to utilize the specific instruction set for the PPU 300. The application may include an API call that is routed to the device driver for the PPU 300. The device driver interprets the API call and performs various operations to respond to the API call. In some instances, the device driver may perform operations by executing instructions on the CPU. In other instances, the device driver may perform operations, at least in part, by launching operations on the PPU 300 utilizing an input/output interface between the CPU and the PPU 300. In an embodiment, the device driver is configured to implement the graphics processing pipeline 600 utilizing the hardware of the PPU 300.

Various programs may be executed within the PPU 300 in order to implement the various stages of the graphics processing pipeline 600. For example, the device driver may launch a kernel on the PPU 300 to perform the vertex shading stage 620 on one SM 440 (or multiple SMs 440). The device driver (or the initial kernel executed by the PPU 400) may also launch other kernels on the PPU 400 to perform other stages of the graphics processing pipeline 600, such as the geometry shading stage 640 and the fragment shading stage 670. In addition, some of the stages of the graphics processing pipeline 600 may be implemented on fixed unit hardware such as a rasterizer or a data assembler implemented within the PPU 400. It will be appreciated that results from one kernel may be processed by one or more intervening fixed function hardware units before being processed by a subsequent kernel on an SM 440.

Machine Learning

Deep neural networks (DNNs) developed on processors, such as the PPU 300 have been used for diverse use cases, from self-driving cars to faster drug development, from automatic image captioning in online image databases to smart real-time language translation in video chat applications. Deep learning is a technique that models the neural learning process of the human brain, continually learning, continually getting smarter, and delivering more accurate results more quickly over time. A child is initially taught by an adult to correctly identify and classify various shapes, eventually being able to identify shapes without any coaching. Similarly, a deep learning or neural learning system needs to be trained in object recognition and classification for it get smarter and more efficient at identifying basic objects, occluded objects, etc., while also assigning context to objects.

At the simplest level, neurons in the human brain look at various inputs that are received, importance levels are assigned to each of these inputs, and output is passed on to other neurons to act upon. An artificial neuron or perceptron is the most basic model of a neural network. In one example, a perceptron may receive one or more inputs that represent various features of an object that the perceptron is being trained to recognize and classify, and each of these features is assigned a certain weight based on the importance of that feature in defining the shape of an object.

A deep neural network (DNN) model includes multiple layers of many connected nodes (e.g., perceptrons, Boltzmann machines, radial basis functions, convolutional layers, etc.) that can be trained with enormous amounts of input data to quickly solve complex problems with high accuracy. In one example, a first layer of the DNN model breaks down an input image of an automobile into various sections and looks for basic patterns such as lines and angles. The second layer assembles the lines to look for higher level patterns such as wheels, windshields, and mirrors. The next layer identifies the type of vehicle, and the final few layers generate a label for the input image, identifying the model of a specific automobile brand.

Once the DNN is trained, the DNN can be deployed and used to identify and classify objects or patterns in a process known as inference. Examples of inference (the process through which a DNN extracts useful information from a given input) include identifying handwritten numbers on checks deposited into ATM machines, identifying images of friends in photos, delivering movie recommendations to over fifty million users, identifying and classifying different types of automobiles, pedestrians, and road hazards in driverless cars, or translating human speech in real-time.

During training, data flows through the DNN in a forward propagation phase until a prediction is produced that indicates a label corresponding to the input. If the neural network does not correctly label the input, then errors between the correct label and the predicted label are analyzed, and the weights are adjusted for each feature during a backward propagation phase until the DNN correctly labels the input and other inputs in a training dataset. Training complex neural networks requires massive amounts of parallel computing performance, including floating-point multiplications and additions that are supported by the PPU 300. Inferencing is less compute-intensive than training, being a latency-sensitive process where a trained neural network is applied to new inputs it has not seen before to classify images, translate speech, and generally infer new information.

Neural networks rely heavily on matrix math operations, and complex multi-layered networks require tremendous amounts of floating-point performance and bandwidth for both efficiency and speed. With thousands of processing cores, optimized for matrix math operations, and delivering tens to hundreds of TFLOPS of performance, the PPU 300 is a computing platform capable of delivering performance required for deep neural network-based artificial intelligence and machine learning applications.

It is noted that the techniques described herein may be embodied in executable instructions stored in a computer readable medium for use by or in connection with a processor-based instruction execution machine, system, apparatus, or device. It will be appreciated by those skilled in the art that, for some embodiments, various types of computer-readable media can be included for storing data. As used herein, a "computer-readable medium" includes one or more of any suitable media for storing the executable instructions of a computer program such that the instruction execution machine, system, apparatus, or device may read (or fetch) the instructions from the computer-readable medium and execute the instructions for carrying out the described embodiments. Suitable storage formats include one or more of an electronic, magnetic, optical, and electromagnetic format. A non-exhaustive list of conventional exemplary computer-readable medium includes: a portable computer diskette; a random-access memory (RAM); a read-only memory (ROM); an erasable programmable read only memory (EPROM); a flash memory device; and optical storage devices, including a portable compact disc (CD), a portable digital video disc (DVD), and the like.

It should be understood that the arrangement of components illustrated in the attached Figures are for illustrative purposes and that other arrangements are possible. For example, one or more of the elements described herein may be realized, in whole or in part, as an electronic hardware component. Other elements may be implemented in software, hardware, or a combination of software and hardware. Moreover, some or all of these other elements may be combined, some may be omitted altogether, and additional components may be added while still achieving the functionality described herein. Thus, the subject matter described herein may be embodied in many different variations, and all such variations are contemplated to be within the scope of the claims.

To facilitate an understanding of the subject matter described herein, many aspects are described in terms of sequences of actions. It will be recognized by those skilled in the art that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar references in the context of describing the subject matter (particularly in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. Furthermore, the foregoing description is for the purpose of illustration only, and not for the purpose of limitation, as the scope of protection sought is defined by the claims as set forth hereinafter together with any equivalents thereof. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

What is claimed is:

1. A computer-implemented method, comprising:
   receiving an instruction specifying a memory block of a memory, wherein the memory block can store values in a compressed or an uncompressed format;
   accessing a compression status corresponding to the memory block, wherein the compression status includes an indication of whether the values associated with the memory block are uniform, wherein the values are uniform when differences between each value and an anchor value is within a predefined threshold;
   determining that the values are uniform based on the indication, wherein the compression status stores an index corresponding to a uniform value of the memory block; and
   in response to determining that the values are uniform, providing a software access to the values, which are otherwise inaccessible to the software.

2. The computer-implemented method of claim 1, wherein the software is user mode software.

3. The computer-implemented method of claim 2, wherein the compression status is accessible by kernel mode software without utilizing the instruction.

4. The computer-implemented method of claim 1, the method further comprising:
   receiving a second instruction specifying the memory block; and
   providing the uniform value that represents all of the values associated with the memory block.

5. The computer-implemented method of claim 4, wherein the uniform value is read from a table referenced by the compression status.

6. The computer-implemented method of claim 4, wherein the uniform value is obtained from the memory block.

7. The computer-implemented method of claim 1, the method further comprising:
   receiving a second instruction that specifies the memory block and an operand; and
   updating the compression status based on the operand.

8. The computer-implemented method of claim 7, wherein the operand indicates that the values of the memory block are in a software-defined compression format.

9. The computer-implemented method of claim 8, the method further comprising:
   receiving a third instruction specifying the memory block and values in the software-defined compression format; and
   writing the values in the software-defined compression format to the memory block.

10. The computer-implemented method of claim 1, wherein the instruction is received at a first processing node, and the method further comprising:
    transmitting from the first processing node information relating to the compression status to a second processing node.

11. The computer-implemented method of claim 10, wherein the memory block stores values in a compressed format, and the method further comprising:
    providing the values in the compressed format to the second processing node.

12. The computer-implemented method of claim 11, the method further comprising:
    wherein the information and values are made accessible to a second software on the second processing node.

13. A computer-implemented method, comprising:
    receiving an instruction specifying a memory block of a memory, wherein the memory block can store values in a compressed or an uncompressed format;
    accessing a compression status corresponding to the memory block, wherein the compression status includes an indication of whether the values associated with the memory block are uniform, wherein the values are uniform when differences between each value and an anchor value is within a predefined threshold;
    determining that the values are uniform based on the indication, wherein the compression status stores an index corresponding to a uniform value of the memory block;
    in response to determining that the values are uniform, providing a software access to the compression status, which is otherwise inaccessible to the software;
    receiving a second instruction that specifies the memory block and an operand, wherein the operand indicates that the values are uniform; and
    updating the compression status based on the operand.

14. A system, comprising:
a processor coupled to a memory and configured to:
- receive an instruction specifying a memory block of the memory, wherein the memory block can store values in a compressed or an uncompressed format;
- access a compression status corresponding to the memory block, wherein the compression status includes an indication of whether the values associated with the memory block are uniform, wherein the values are uniform when differences between each value and an anchor value is within a predefined threshold;
- determine that the values are uniform based on the indication, wherein the compression status stores an index corresponding to a uniform value of the memory block; and
- in response to determining that the values are uniform, provide a software access to the values, which are otherwise inaccessible to the software.

15. The system of claim 14, wherein the software is user mode software.

16. The system of claim 15, wherein the compression status is accessible by kernel mode software without utilizing the instruction.

17. The system of claim 14,
wherein the processor is further configured to:
- receive a second instruction specifying the memory block; and
- provide a uniform value that represents all of the values associated with the memory block.

18. The system of claim 17, wherein the uniform value is read from a table referenced by the compression status.

19. The system of claim 17, wherein the uniform value is obtained from the memory block.

20. The system of claim 14, wherein the processor is further configured to:
- receive a second instruction that specifies the memory block and an operand; and
- update the compression status based on the operand.

21. The system of claim 20, wherein the operand indicates that the values of the memory block are in a software-defined compression format.

22. The system of claim 21,
wherein the processor is further configured to:
- receive a third instruction specifying the memory block and values in the software-defined compression format; and
- write the values in the software defined compression format to the memory block.

23. The system of claim 14, wherein the instruction is received at a first processing node, and the processor is further configured to:
- transmit from the first processing node information relating to the compression status to a second processing node.

24. The system of claim 23, wherein the memory block stores values in a compressed format, and the processor is further configured to:
- provide the values in the compressed format to the second processing node.

25. The system of claim 24,
wherein the information and values are made accessible to a second software on the second processing node.

26. A system, comprising:
a processor coupled to a memory and configured to:
- receive an instruction specifying a memory block of the memory, wherein the memory block can store values in a compressed or an uncompressed format;
- access a compression status corresponding to the memory block, wherein the compression status includes an indication of whether the values associated with the memory block are uniform, wherein the values are uniform when differences between each value and an anchor value is within a predefined threshold; and
- determine that the values are uniform based on the indication, wherein the compression status stores an index corresponding to a uniform value of the memory block;
- in response to determining that the values are uniform, provide a software access to the compression status, which is otherwise inaccessible to the software;
- receive a second instruction that specifies the memory block and an operand, wherein the operand indicates that the values are uniform; and
- update the compression status based on the operand.

* * * * *